(12) United States Patent
Maruyama

(10) Patent No.: US 6,646,464 B2
(45) Date of Patent: Nov. 11, 2003

(54) DATA HOLD CIRCUIT, A SEMICONDUCTOR DEVICE AND A METHOD OF DESIGNING THE SAME

(75) Inventor: Tetsuya Maruyama, Ome (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/020,312

(22) Filed: Dec. 18, 2001

(65) Prior Publication Data

US 2002/0074609 A1 Jun. 20, 2002

(30) Foreign Application Priority Data

Dec. 18, 2000 (JP) .......................... 2000-383591

(51) Int. Cl.[7] .................... H03K 19/23; H03K 19/173
(52) U.S. Cl. ...................... 326/35; 326/46; 327/199
(58) Field of Search ........................ 326/46, 40, 35, 326/11, 93, 96; 327/199–200, 202–203, 208–211, 218

(56) References Cited

U.S. PATENT DOCUMENTS

| | | | | |
|---|---|---|---|---|
| 5,245,311 A | * | 9/1993 | Honma | ............ 340/146.2 |
| 5,274,628 A | * | 12/1993 | Thaller et al. | ............ 370/304 |
| 5,418,822 A | * | 5/1995 | Schlachter et al. | ............ 375/354 |
| 6,108,794 A | * | 8/2000 | Erickson | ............ 713/401 |
| 6,239,629 B1 | * | 5/2001 | Erickson | ............ 327/141 |

FOREIGN PATENT DOCUMENTS

| | | | | |
|---|---|---|---|---|
| JP | 60079821 A | * | 5/1985 | ........ H03K/19/00 |
| JP | 10-199996 | | 1/1997 | |

* cited by examiner

Primary Examiner—Michael Tokar
Assistant Examiner—James Cho

(57) ABSTRACT

A semiconductor integrated circuit technology that does not invite the drop of α-ray resistance of flip-flop circuits even when devices are miniaturized. A data hold circuit according to this semiconductor integrated circuit technology includes at least three flip-flop circuits using the same signal as an input, and a majority logic circuit for outputting a signal in accordance with a logic value of the majority of the output of these flip-flop circuits.

27 Claims, 18 Drawing Sheets

DATA HOLD CIRCUIT, A SEMICONDUCTOR DEVICE AND A METHOD OF DESIGNING THE SAME

BACKGROUND OF THE INVENTION

This invention relates to an α(alpha)-ray assurance technology in semiconductor devices. More particularly, this invention relates to a technology for preventing an error operation of flip-flop circuits due to the α-rays, and provides flip-flop circuits having high α-ray resistance, a semiconductor device, a designing method of the semiconductor device and a database for the designing method.

A flip-flop type latch circuit has widely been employed as a circuit for temporarily holding data or a signal level in semiconductor integrated circuits, particularly in logical integrated circuits.

As an amount of the charge built up inside a flip-flop circuit becomes smaller with microstructuring of semiconductor elements in a semiconductor integrated circuit, inversion of a potential due to the charge generated by the α-rays is more likely to develop. The semiconductor integrated circuit uses a large number of flip-flop circuits, in particular. Since the number of constituent elements is large, too, the flip-flop circuit is constituted in most cases by the smallest constituent devices. Once the potential is inverted, it continues outputting error values until a normal value is acquired next, and the influences are great, too. For this reason, the error operation resulting from the α-rays is more likely to occur. To cope with the α-rays, proposals have been made in the past to positively apply a capacitor to internal nodes of the flip-flop circuit or to intentionally increase parasitic capacitance (refer to JP-A-10-199996).

SUMMARY OF THE INVENTION

In the semiconductor integrated circuit, the size of the semiconductor element (hereinafter also called merely the "element") and the operation frequency are substantially inversely proportional to each other. Therefore, to suppress the increase of power consumption due to the increase of the operation frequency, the flip-flop circuit is designed in many cases in such a fashion that parasitic capacitance of internal nodes decreases in proportion to miniaturization of the semiconductor elements. On the other hand, the amount of the charge that is generated when the α-rays pass through the flip-clop circuit decreases with miniaturization of the elements, but the amount of its decrement is smaller than the amount of decrease of the parasitic capacitance of the internal nodes brought forth by miniaturization of the element.

It has been found that the α-ray assurance technology that applies the capacitance to the internal node involves the following problems. As miniaturization of the devices proceeds, a capacitor of a relatively greater capacitance becomes necessary inside the flip-flop circuit, and the operation speed, power consumption and an occupying area are sacrificed. Whenever the size of devices constituting the flip-flop circuit or the value of a power source voltage used is changed, the capacitance to be imparted to the internal nodes of the flip-flop circuit must be estimated once again and this becomes a large burden to design.

MOS transistors having a high threshold value are often used to constitute a logic circuit in CMOS-LSI to reduce a standby current. When the threshold value of the MOS transistors is raised, however, driving power drops and ON resistance becomes great. Consequently, it becomes more difficult for the node, whose potential has changed due to the α-rays, to return to the original potential. In this case, a logic gate of a next stage is more likely to respond to the change before the return of the potential and to cause an error operation. The power source voltage of LSI has been lowered, but the error operation becomes more likely to occur when the power source voltage drops and driving power of the MOS transistors drops, or when the amount of the charge built up in the internal node decreases.

It is an object of the present invention to provide a semiconductor integrated circuit technology that can ensure α-ray resistance or α-ray immunity of flip-flop circuits even when semiconductor elements are miniaturized.

It is another object of the present invention to provide a semiconductor integrated circuit technology that does not require to design once again a circuit construction of flip-flop circuits or capacitance of internal nodes in accordance with the size of semiconductor elements or with a value of a power source voltage to ensure α-ray resistance of the flip-flop circuits even when the semiconductor elements are miniaturized or when the value of the power source voltage is changed.

It is still another object of the present invention to provide a semiconductor integrated circuit technology that can prevent the error operation resulting from the α-rays of flop-flop circuits even when a threshold value of MOS transistors is raised or when the value of the power source voltage used becomes lower.

These and other objects and novel features and advantages of the present invention will become more apparent from the following detailed description of embodiments taken in conjunction with the accompanying drawings.

Typical aspects of the present invention disclosed herein are as follows.

According to an aspect of the present invention, a data hold circuit comprises at least three flip-flop circuits for inputting the same signal, and a majority logic circuit for outputting a signal in accordance with a logic value of the majority of the outputs of the flip-flop circuits. Therefore, even when an α-ray passes through any of the flip-flop circuits and the output changes, the other flip-flop circuits can keep a correct output signal and reliability of the circuit can be improved. Moreover, unlike a flip-flop circuit that is so constituted as to keep a level by means of only the charge of capacitor, the data hold circuit of this invention can reliably avoid the error operation resulting from the α-ray even when the elements are miniaturized.

In the aspect of the present invention described above, the three or more flip-flop circuits described above are so constituted as to acquire input signals on the basis of mutually different clock signals synchronized with one another. In consequence, the data hold circuit can keep a correct output signal even when any noise overlaps with the clock signals or when an error pulse occurs due to the incidence of the α-rays to clock amplifiers and any of the flip-flop circuits acquire an error data, and reliability of the circuit can be further improved.

In the construction described above, two flip-flops among the three flip-flop circuits acquire the input signals on the basis of mutually different two clock signals synchronized with each other, and the other one flip-flop circuit is so constituted as to use the two clock signals as its input and to acquire its input signal on the basis of an output signal of a logic circuit whose output changes in accordance with the normal change of these clock signals. This construction can prevent the error operation of the flip-flop circuits due to the noise overlapping with the clock signals and due to the incidence of the α-rays to the clock amplifier, and can decrease the number of signal lines for supplying the clock signals. The clock signal for the flip-flop circuits may be used in common, provided that the influences of the noise and the α-rays on the clock signals can be neglected.

The flip-flop circuit described above is a flip-flop circuit with a diagnosis function that is equipped with a scan-in terminal and a scan-out terminal for test data. Therefore, it is possible to diagnose each of the majority logic circuit and the flip-flop circuit.

In two of the three flip-flop circuits described above, switch means for switching common scan-in data and the output from the scan-out terminal of the other flip-flop circuit is disposed as a pre-stage circuit of the scan-in terminal. When the common scan-in data is selected, the number of scan-in data can be decreased and a general logic circuit among the flip-flops can be efficiently diagnosed. When the scan-out terminal of the other flip-flop circuit is selected, the number of scan-in data increases, but the diagnosis of the majority logic circuit and the flip-flop circuits becomes possible, and when these two test modes are switched and selected, the test of the overall circuit can be made efficiently.

According to another aspect of the present invention, a data hold circuit comprises two flip-flop circuits so constituted as to input the same signal and to acquire an input signal on the basis of the same clock signal or mutually different clock signals synchronized with each other, and a logic circuit whose output changes in accordance with the normal change of output signals of the flip-flop circuits. Consequently, even when the α-rays pass through any of the flip-flop circuits and change its output, the output of the logic circuit of the subsequent stage does not change so long as both outputs change. Therefore, the correct output signal can be kept and reliability of the circuit can be improved. Unlike the flip-flop circuit so constituted as to suppress the inversion of the level by means of the charge of the capacitance upon incidence of the α-rays, the data hold circuit of this invention can reliably avoid the error operation resulting from the α-rays even when the devices are miniaturized.

Here, it is possible to use, as the logic circuit described above, a circuit which has first and second inputs and one output, and in which the logic value of the output is equal to the input when the logic values of the first and second input are equal to each other, and is equal to the logic value of a just previous output when the logic values of the first and second inputs are different from each other, or a circuit which has first and second inputs and one output, and in which the logic value of the output is an inversion value of the input when the logic values of the first and second inputs are equal to each other, and is equal to the logic value of the just immediate output when the logic values of the first and second inputs are different from each other, or a circuit which has first and second inputs and one output, and in which the logic value of the output is equal to the logic value of the just previous output when the logic values of the first and second inputs are equal to each other, and is equal to the logic value of the first input when the logic values of the first and second inputs are different from each other.

The logic circuit described above can be constituted in the following way, too. The logic circuit comprises a majority logic circuit which has three inputs and one output and the output of which is decided by the majority of at least two inputs. The three inputs are the outputs of the two flip-flop circuits described above and the output of the majority logic circuit. In this way, a logic circuit operating statically can be accomplished, and correct data can be held even when the flip-flop circuits do not operate for a long time.

Further, the logic circuit includes first and second differential circuits each receiving the clock signal described above supplied as a differential signal, and outputting a signal that changes in accordance with the change of the clock signal, wherein the two flip-flop circuits described above are so constituted as to acquire the inputs, respectively, on the basis of the outputs of the first and second differential circuits. In consequence, even when the noise having the same phase overlaps with the clock signal, it becomes possible to prevent the flip-flop circuits from erroneously fetching the data.

The first and second differential circuits are constituted in such a fashion that their outputs are equal to the logic value of either one of the clock signals when the logic values of the differential clock signals inputted are different from each other, and are equal to the logic value of the just immediate output when the logic values of the differential clock signals are equal to each other. In this way, it is possible to prevent the flip-flop circuits from erroneously fetching the data even when the noise overlaps with either one of the differential clock signals or when the α-rays are incident to the clock amplifiers.

Further, the flip-flop circuit described above uses a flip-flop circuit with a diagnosis function that is equipped with a scan-in terminal and a scan-out terminal for test data. Therefore, each of the logic circuit and the flip-flop circuit can be diagnosed.

A data hold circuit according to still another aspect of the present invention comprises first and second flip-flop circuits using the same signal as an input, and acquiring input signals on the basis of the same clock signal or mutually different clock signals synchronized with each other, first and second logic circuits whose output changes in accordance with the normal change of the output signals of the flip-flop circuits, a third flip-flop circuit using the output signal of the first logic circuit as an input thereof, a fourth flip-flop circuit using the output signal of the second logic circuit as an input thereof, and a third logic circuit whose output changes in accordance with the normal change of the output signals of the third and fourth flip-flop circuits, wherein the first and second flip-flop circuits enter a data-through state in the first state of the clock signal and a data-hold state in the second state of the clock signal, and the third and fourth flip-flop circuits enter the data-hold state in the first state of the clock signal and the data-through state in the second state of the clock signal. Accordingly, even when the α-rays pass through the flip-flop circuit simultaneously with the change of the clock signal and the error operation in which the output that should inherently change does not change occurs, the data hold circuit can hold the correct data.

A semiconductor device according to still another aspect of the present invention comprises an internal circuit having the data hold circuit described above and constituted by MOS transistors, and an output circuit for receiving signals from the internal circuit and outputting signals to outside, wherein a gate width of the MOS transistors constituting the data hold circuit is smaller than at least a gate width of MOS transistors constituting the output circuit. Therefore, even when the device size of the MOS transistors constituting the flip-flop circuits are small, too, the error operation of the flip-flop circuits resulting from the α-rays can be reliably avoided.

In the semiconductor device having bonding bumps at a center portion of a semiconductor chip on which the semiconductor device including a data hold circuit is formed, the data hold circuit disposed in the proximity of the bumps includes a plurality of flip-flops for inputting the same signal, and has a multiplex structure whose output changes in accordance with a logic value of the majority of the outputs of the flip-flops. Therefore, even when the material of the bumps itself emits the α-rays, the flip-flops in the proximity of the bumps have high α-ray resistance, and a circuit in which the error operation due to the α-rays is difficult to occur can be obtained.

According to still another aspect of the present invention, there is provided a method of designing a semiconductor device including flip-flop circuits by utilizing a computer, comprising the steps of inputting an allowable error operation number per predetermined time into the computer, and selecting a circuit to be used from among those circuits which are registered in advance, on the basis of the allowable error operation number per predetermined time so inputted. Thereby, it becomes possible to use a circuit highly resistant to the α-rays for a circuit having a small allowable error operation number per predetermined time and a circuit having low resistance to the α-rays but having a small number of devices for a circuit having a large number of allowable error operation umber per predetermined time. In this way, the error operation resulting from the α-rays can be reduced while the increase of an occupying area of circuits is restricted.

Preferably, the step of selecting the circuit selects a circuit to be used from the circuits registered in advance, on the basis of the allowable error operation number per predetermined time so inputted and a required speed. Thereby, a semiconductor device having less error operation resulting from the α-rays and capable of operating at a desired speed can be accomplished.

The step of selecting the circuit described above selects the circuit to be used in accordance with the degree of the allowable error operation number per predetermined time inputted from at least two circuits consisting of a multiplex data hold circuit using a plurality of flip-flop circuits and a majority logic circuit, a duplex data hold circuit using two flip-flop circuits and a logic circuit for eliminating an error pulse, a data hold circuit equipped with capacitor that positively applies the capacitor to internal nodes, and a high multiplying type data hold circuit that improves driving force by connecting a plurality of inverters in parallel, when it selects the data hold circuit. In this way, the error operation resulting from the α-rays can be reduced while the increase of the occupying area is restricted.

The step of selecting the circuit described above selects the circuit to be used from at least two consisting of a multiplex data hold circuit using a plurality of flip-flop circuits and a majority logic circuit, a duplex data hold circuit using two flip-flop circuits and a logic circuit for eliminating an error pulse, a data hold circuit equipped with capacitor that positively applies the capacitor to internal nodes, and a high multiplying type data hold circuit that improves driving force by connecting a plurality of inverters in parallel, in accordance with the degree of the allowable error operation number per predetermined time inputted, a package structure employed, a process, a wiring material and an arrangement of bumps. Thereby, the error operation resulting from the α-rays can be reduced while the increase of the occupying area is restricted, and a semiconductor device having high reliability and capable of preventing reliably the error operation resulting from the α-rays irrespective of the package structure, the process, the wiring material and the bump arrangement can be accomplished.

According to still another aspect of the present invention, there is provided a database registering a plurality of unit circuit information having the same function, for use in a designing method of a semiconductor device by utilizing a computer, wherein the unit circuit information contains information about an allowable error operation umber per predetermined time. Therefore, a semiconductor device can be accomplished that comprises an optimum combination of circuits in accordance with the allowable error operation number per predetermined time required for the circuits.

Preferably, the database described above further includes unit circuit information having information about the allowable error operation number and unit circuit information not having information about the allowable error operation number. According to this arrangement, the information about the allowable error operation number need not be prepared for all the unit circuits, and configuration of the database becomes easier.

DESCRIPTION OF THE EMBODIMENTS

Hereinafter, embodiments of the present invention will be explained with reference to the accompanying drawings.

Figure 1:
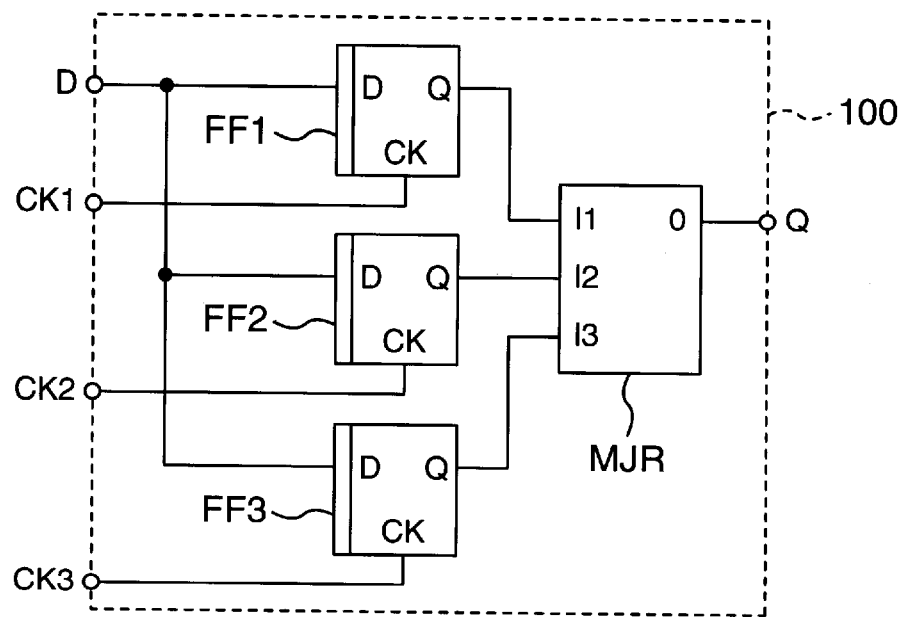
FIG. 1 is a structural circuit diagram showing an α-ray assurance flip-flop circuit according to a first embodiment of the present invention.

FIG. 1 shows an α-ray assurance flip-flop circuit according to the first embodiment of the present invention. The α-ray assurance flip-flop circuit 100 according to this embodiment includes three flip-flops FF1 to FF3 to which a signal from the same input terminal D is inputted, and a majority logic circuit MJR for outputting a signal having the same logic as the output of the majority of the output signals of these flip-flops, that is, at least two flip-flops having the same logic among the three signals.

Mutually different clock signals CK1 to CK3 are supplied to the three flip-flops FF1 to FF3, and the flip-flops acquire and hold the signal inputted to the data terminal D in synchronism with these clock signals CK1 to CK3, respectively. Therefore, even when the α-rays pass through any one of these flop-flops FF1 to FF3 and the latch data is inverted, the majority logic circuit MJR neglects the signal change due to the α-rays. It is thus possible to prevent the error operation of the flip-clop circuit 100.

Incidentally, the three clock signals CK1 to CK3 have the same timing, and are generated by distributing a clock signal as an original signal by use of a plurality of clock buffers, for example. As the clock signals for allowing the flip-flops FF1 to FF3 to conduct the latch operation are separate signals, it is only one flip-flop whose output changes due to a noise even when the noise overlaps with any of the clock signals, and the majority logic circuit MJR cuts off the signal change resulting from the noise. In consequence, it becomes possible to prevent the error operation of the flip-flop circuit 100.

However, it is not always necessary to use the three clock signals CK1 to CK3. When signal lines for supplying the clocks are known in advance to be highly resistant to the α-rays and to the noise from the design aspect of the circuit characteristics, for example, these three flip-flops FF1 to FF3 can be operated by supplying a common clock signal.

Figure 2:
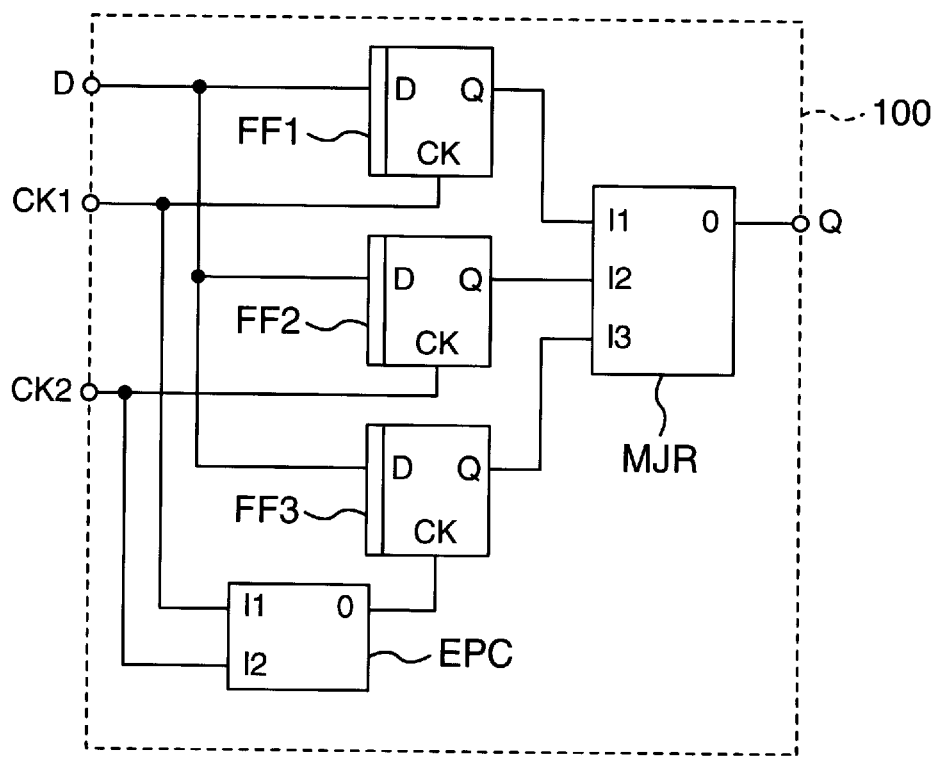
FIG. 2 is a structural circuit diagram showing an α-ray assurance flip-flop circuit according to a second embodiment of the present invention.

FIG. 2 shows the α-ray assurance flip-flop circuit 100 according to the second embodiment of the present invention. In this embodiment, the number of the clock signals for the flip-flop circuit 100 in FIG. 1 is decreased by one to two clock signals CK1 and CK2, and an error pulse eliminating circuit EPC is provided to input these two clock signal CK1 and CK2. The detail of this error pulse eliminating circuit EPC is shown in FIG. 7. The output signal of this error pulse eliminating circuit EPC is used as the clock for the third flip-flop FF3. This embodiment can decrease the number of clock supply wirings disposed on the chip of the semiconductor integrated circuit in comparison with the first embodiment. Even when the noise overlaps with the clock signal, this embodiment can prevent the change of the output of the flip-flop circuit 100 due to such a noise.

Figure 3A:
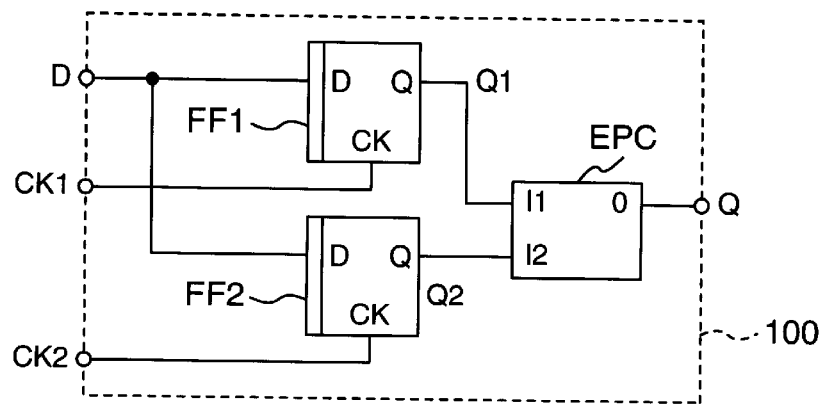
FIGS. 3A and 3B are a structural circuit diagram showing an α-ray assurance flip-flop circuit according to a third embodiment of the present invention and its waveform diagram, respectively.

FIG. 3A depicts an α-ray assurance flip-flop circuit according to the third embodiment of the present invention. In this embodiment, the number of flip-flops and the number of clock signals in the flip-flop circuit 100 in FIG. 1 are decreased by one, respectively, to FF1 and FF2 and CK1 and CK2, and an error pulse eliminating circuit EPC for inputting the output signals of these two flip-flops FF1 and FF2 is disposed as their post-stage circuit. According to this embodiment, the number of clock supply wirings on the chip of the semiconductor integrated circuit can be decreased and the scale of the flop-flop circuit itself, that is, the number of constituent elements, can be decreased in comparison with the first embodiment.

Figure 3B:
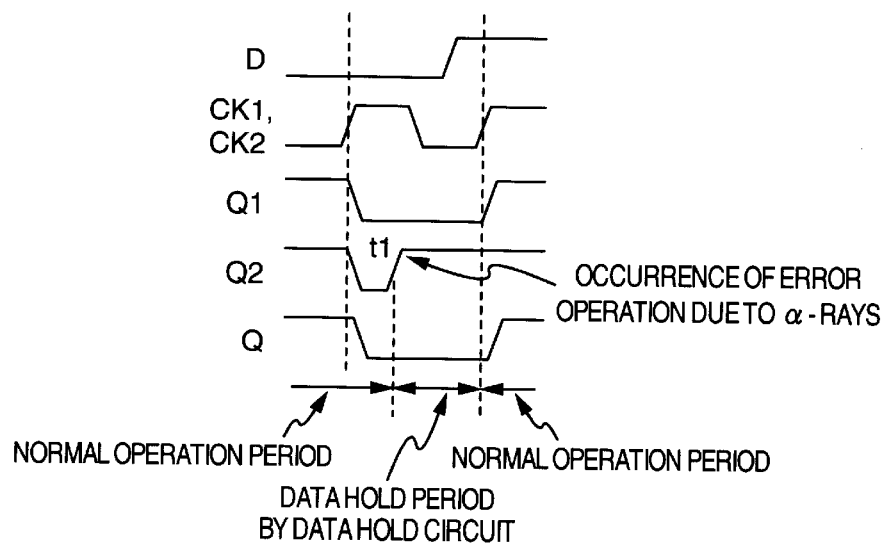

Moreover, the circuit of this embodiment has the merit that even when the output (represented by Q2 in FIG. 3B) of one of the flip-flops changes due to the α-rays as represented by timing t1 in FIG. 3B, the error pulse eliminating circuit EPC can prevent the change of the circuit output. Even when the noise overlaps with the clock signal CK1 or CK2 and invites the change of the output of either the flip-flop FF1 or FF2, the error pulse eliminating circuit EPC can prevent the change of the circuit output.

Figure 4:
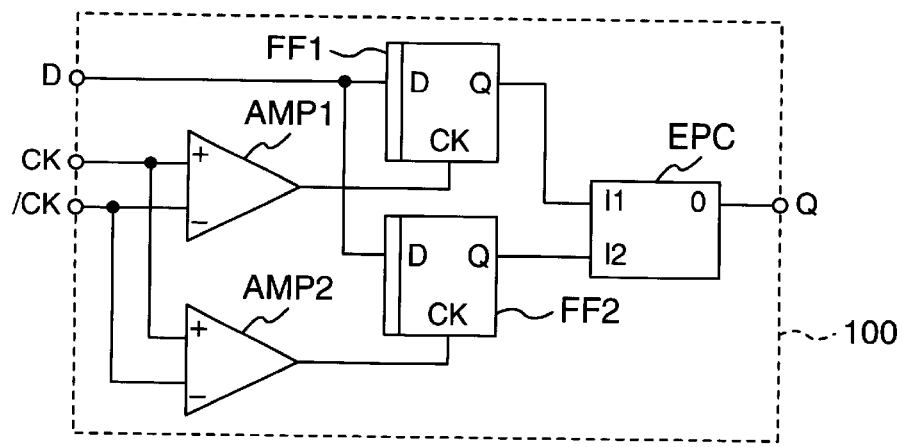
FIG. 4 is a structural circuit diagram showing a modified example of the flip-flop circuit shown in FIG. 3.

FIG. 4 shows a modified example of the embodiment shown in FIG. 3. The clock signals CK1 and CK2 of the flip-flops FF1 and FF2 in the flip-flop circuit 100 shown in FIG. 3 are changed to differential signals CK and /CK (inverted CK), and differential amplifiers AMP1 and AMP2 for inputting these differential clock signals CK and/CK are disposed as the pre-stage circuits of the flip-flops FF1 and FF2. Even when the output of one of the flip-flops changes due to the α-ray, the error pulse eliminating circuit EPC can prevent the change of the circuit output.

This embodiment uses the differential amplifiers AMP1 and AMP2 for inputting the differential clock signals CK and/CK and can cut off the noise of the same phase that overlaps otherwise with the differential clock signals CK and/CK. Therefore, even when the noise having the same phase overlaps with the differential clock signals CK and/CK, this embodiment can prevent the flip-flops FF1 and FF2 from erroneously latching the data. An error pulse eliminating circuit shown in FIG. 7C can be used in place of the differential amplifiers AMP1 and AMP2.

Figure 5A:
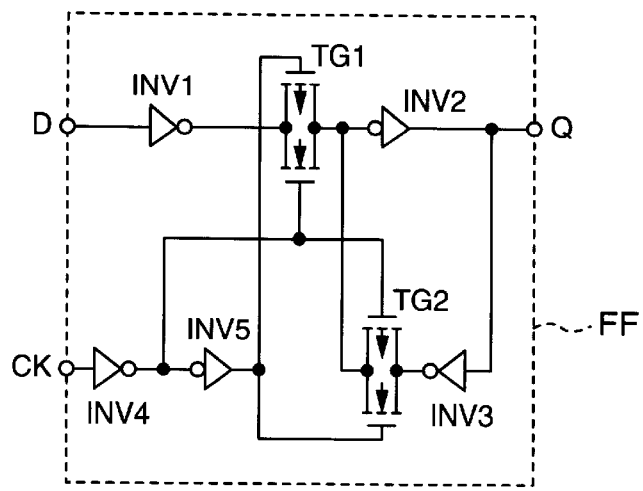
FIGS. 5A to 5C are circuit diagrams showing a concrete example of a flip-flop constituting the α-ray assurance flip-flop circuit according to the present invention, respectively.
Figure 5B:
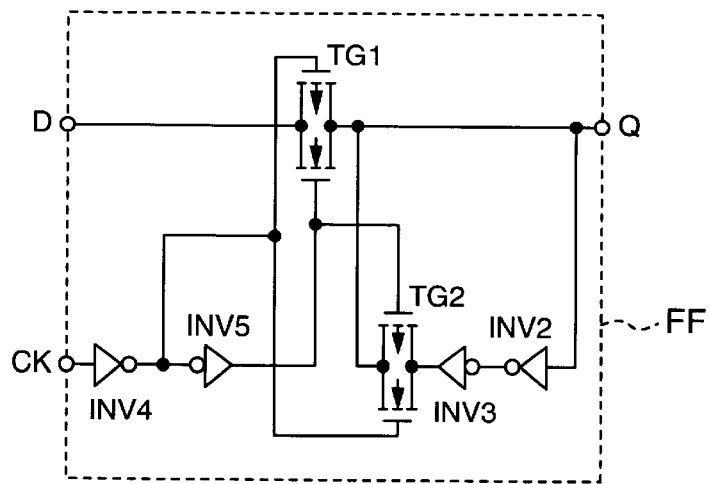
Figure 5C:
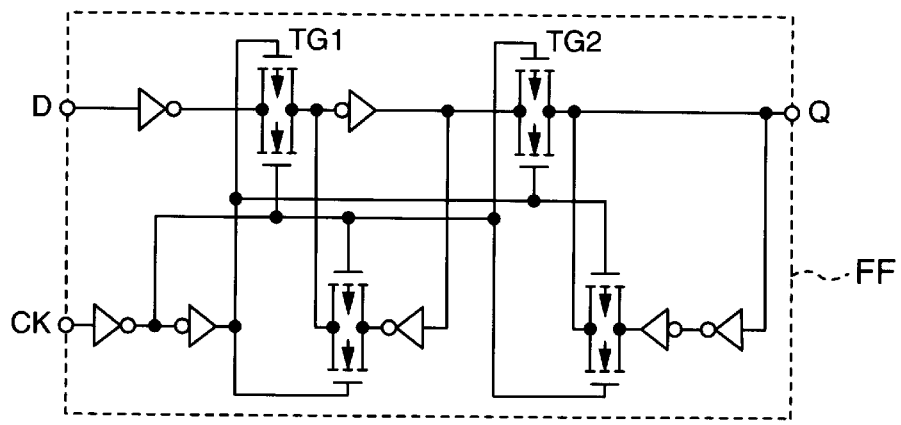
Figure 6:
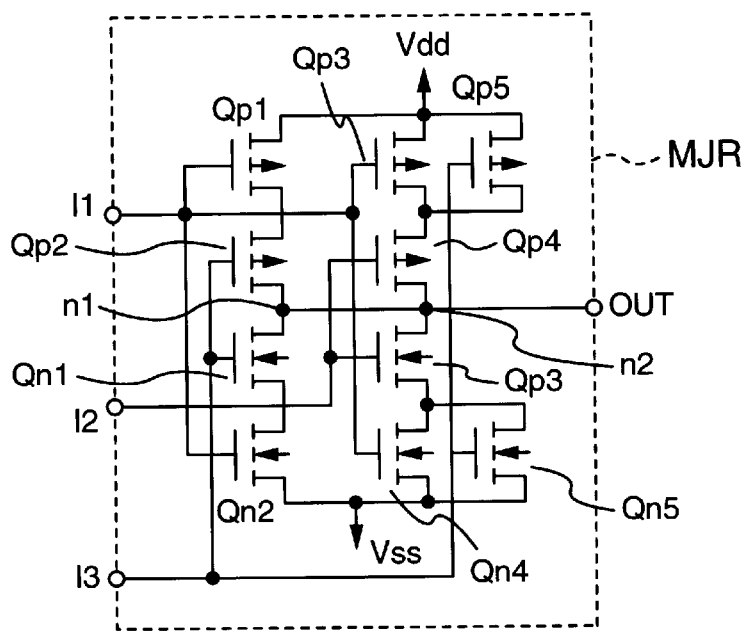
FIG. 6 is a circuit diagram showing a concrete example of a majority logic circuit constituting the α-ray assurance flip-flop circuit according to the present invention.
Figure 7A:
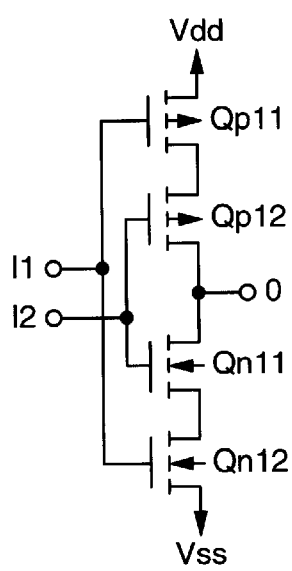
FIGS. 7A to 7C are circuit diagrams showing a concrete example of an error pulse eliminating circuit constituting the α-ray assurance flip-flop circuit according to the present invention, respectively.
Figure 7B:
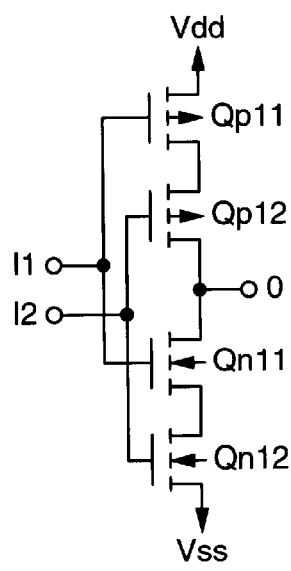
Figure 7C:
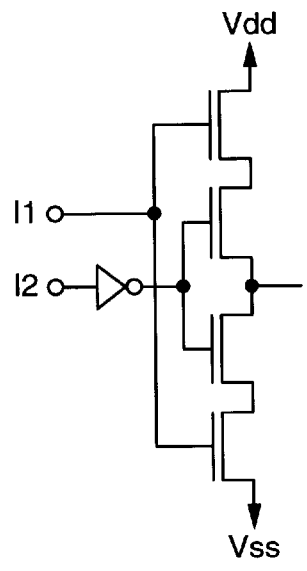

FIGS. 5A, 5B and 5C show structural examples of the flip-flops FF1 to FF3 described above, FIG. 6 shows a structural example of the majority logic circuit, and FIGS. 7A, 7B and 7C show structural examples of the error pulse eliminating circuit EPC.

The flip-flop FF shown in FIG. 5A includes an inverter INV1 and a transmission gate TG1 for acquiring the input, an outputting inverter INV2, a feeding-back inverter INV3 and a transmission gate TG2 for feedback, and clock inverters INV4 and INV5. The clock signal CK complementally turns ON and OFF the transmission gates TG1 and TG2. When the transmission gate TG1 is turned ON, the signal of the input terminal D is acquired. When TG2 is turned ON, TG1 is turned OFF, and the outputting inverter INV2 and the feedback inverter INV3 hold the data.

In the flip-flop FF shown in 5B, the inverter INV1 of the flip-flop FF shown in FIG. 5A is omitted. When the clock signal CK is at the high level, the transmission gate TG1 is turned ON and the input signal IN is as such outputted. When the clock signal CK is at the low level, the transmission gate TG1 is turned OFF while TG2 is turned ON, so that the inverters INV2 and INV3 latch the signal and output that signal.

Referring to FIG. 5C, the flip-flop FF shown in FIG. 5B is disposed in the post-stage of the flip-flop shown in FIG. 5A so as to constitute a flip-flop having a master-slave configuration.

Next, as shown in FIG. 6, the majority logic circuit MJR includes a pre-stage circuit and a post-stage circuit. The pre-stage circuit is formed by connecting in series two p channel MOSFET Qp1 and Qp2 and two n channel MOSFET Qn1 and Qn2 between power source voltages Vdd and Vss. The post-stage circuit is formed by connecting in series two p channel MOSFET Qp3 and Qp4 and two n channel MOSFET Qn3 and Qn4 between the power source voltages Vdd and Vss, and further connecting MOSFET Qp5 and Qn6 in parallel with Qp3 and Qn4, respectively. A connection node between Qp2 and Qn1 and a connection node between Qp4 and Qn3 are connected to the output terminal OUT.

The input signal I1 is applied to the gate terminals of Qp1 and Qn2 and Qp3 and Qn4, and the input signal I2 is applied to the gate terminals of Qp4 and Qn3. The input terminal I3 is applied to the gate terminals of Qp2 and Qn1 and Qp5 and Qn5. In consequence, the majority logic circuit MJR operates in such a fashion as to output the signal that is an inversion signal of the logic of at least two of the same signals among the three input signals I1 to I3. Incidentally, when it is desired to output a signal having the same logic as that of at least two same signals, an inverter may well be connected to the output terminal of the majority logic circuit MJR shown in FIG. 6.

As shown in FIGS. 7A and 7B, the error pulse eliminating circuit EPC can use a circuit formed by connecting in series two p channel MOSFET Qp11 and Qp12 and two n channel MOSFET Qn11 and Qn12 between the power source voltages Vdd and Vss. In the circuit shown in FIG. 7A, the input signal I1 is applied to the gate terminals of Qp11 and Qn12 and the input signal I2, to the gate terminals of Qp12 and Qn11. In the circuit shown in FIG. 7B, the input signal I1 is applied to the gate terminals of Qp11 and Qn11 and the input signal I2, to the gate terminals of Qp12 and Qn12.

In consequence, these circuits output the signals formed by inverting the logic of the input signals I1 and I2 when these signals are coincident, and the output attains the high impedance when the input signals I1 and I2 are not coincident. Therefore, even when the noise overlaps with either one of the input signals I1 and I2, the output does not change, provided that the signals of the same phase are inputted as the input signals I1 and I2, and these circuits so operate as to output the just previous level by the charge held on the parasitic capacitor.

When this error pulse eliminating circuit EPC is used as a circuit for eliminating the same phase noise from the differential clocks CK and/CK in place of the differential amplifiers AMP1 and AMP2 in the embodiment shown in FIG. 4, an inverter is disposed on the side of one of the inputs (I2 in FIG. 7) as shown in FIG. 7C. According to this circuit arrangement, the same phase noise overlapping with the differential clocks CK1 and/CK1 is inputted as the signal having the opposite phase to the gate terminals of Qp11 and Qn12 and to the gate terminals of Qp12 and Qn11. Therefore, the output does not change.

Figure 24A:
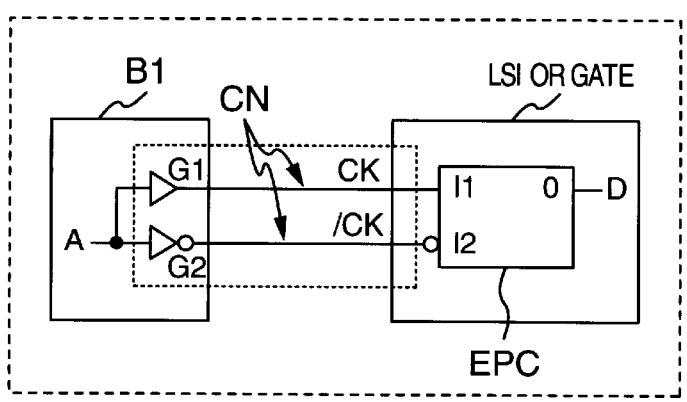
FIGS. 24A and 24B are a structural circuit diagrams of a clock signal supply system for a flip-flop that uses an error pulse eliminating circuit EPC in place of differential amplifiers AMP1 and AMP2 in the embodiment shown in FIG. 4 and a waveform diagram showing a waveform of each signal, respectively.
Figure 24B:
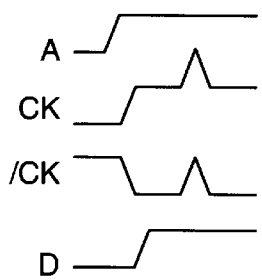

More concretely, it will be assumed herby that a cross-talk noise CN enters signal lines L1 and L2 from other signals in the proximity of these signals lines L1 and L2 when the differential signals C and B (CK,/CK) are inputted from the logic gates G1 and G2 of other circuit block B1 to the error pulse eliminating circuit EPC through the signal lines L1 and L2 as shown in FIG. 24A. In this instance, since the noise is the same phase noise as represented by the waveforms of the differential signals C and B (CK,/CK) shown in FIG. 24B, the noise does not appear in the output D of the error pulse eliminating circuit EPC.

Incidentally, the error pulse eliminating circuit EPC shown in FIG. 24A can be used for a substitution circuit of an input buffer including differential buffers for exchanging signals between LSIs. In this case, other circuit block B1 in FIG. 24A is regarded as other LSI element and the logic gates G1 and G2, as output buffer circuits. Printed wires formed on a printed substrate constitute the signal lines L1 and L2.

Figure 8:
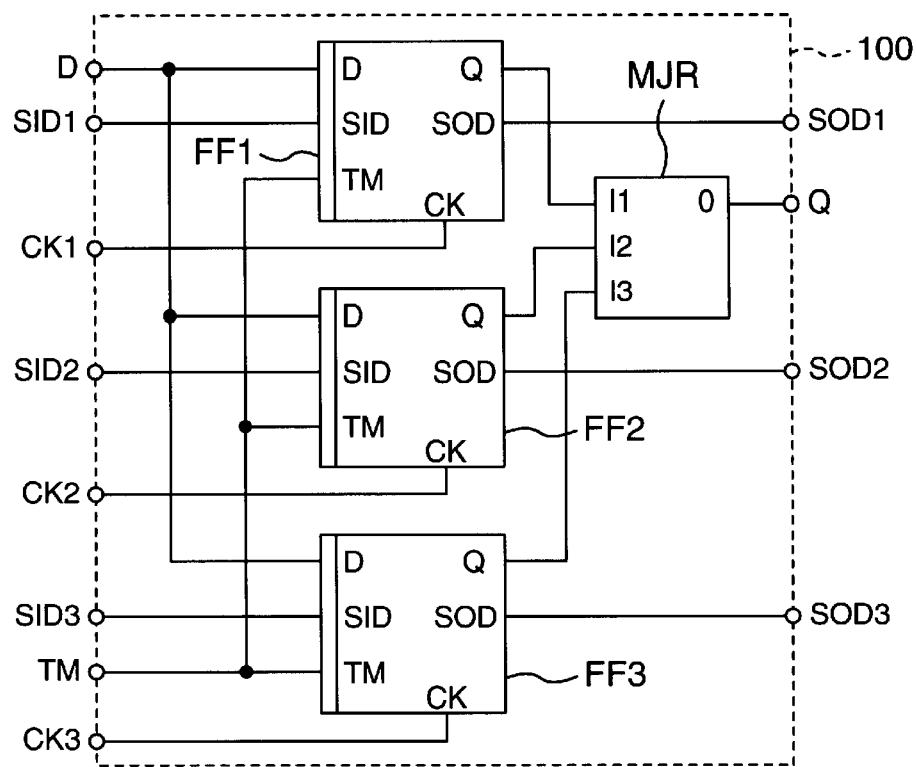
FIG. 8 is a structural circuit diagram showing an α-ray assurance flip-flop circuit according to a fourth embodiment of the present invention.

FIG. 8 shows an α-ray assurance flip-flop circuit 100 according to the fourth embodiment of the present invention. This embodiment substitutes flip-flops having a scan-in/scan-out function for constituting a test scan path for the flip-flops FF1 to FF3 used in the embodiment shown in FIG. 1, and further includes input terminals SID1 to SID3 of scan-in data, an input terminal TM for a clock signal for scanning and output terminals SOD1 to SOD3 for scan-out data.

This embodiment provides the merit that even in the flip-flop circuit 100 having the scan path for testing, the majority logic circuit MJR prevents the error function due to the α-ray in the same way as the first embodiment. In this embodiment, the input terminals SID1 to SI3 for the scan-in data and the output terminals SOD1 to SOD3 for the scan-out data are so disposed as to correspond to the flip-flops FF1 to FF3, respectively. Therefore, since the independent test value can be transferred to each flip-flop, the test of each flip-flop and the test of the majority logic circuit MJR can be carried out.

Incidentally, it would be possible to modify the embodiment shown in FIG. 8 by changing the number of flip-flops to 2, to omit the majority logic circuit MJR and to dispose the error pulse eliminating circuit EPC as the post-stage circuit of the flip-flop in the same way as in the third embodiment wherein the embodiment shown in FIG. 1 is modified by changing the number of flip-flops to 2, omitting the majority logic circuit MJR and disposing the error pulse eliminating circuit EPC as the post stage circuit of the flip-flop from the embodiment shown in FIG. 1. Circuits shown in FIGS. 12 to 15 may be used as the error pulse eliminating circuit EPC besides the circuits shown in FIGS. 7A and 7B. FIGS. 12A to 15A are concrete circuit diagrams, respectively, and FIGS. 12B to 15B are logic structural views using the circuits shown in FIGS. 12A to 15B as the logic gate, respectively.

The circuits shown in FIGS. 7A and 7B are those types of circuits which dynamically operate to output the just previous level by means of the charge built up in the parasitic capacitor as the output attains the high impedance when the input signals I1 and I2 are not coincident. In contrast, the output of the circuits shown in FIGS. 12 to 15 does not attain the high impedance when the input signals I1 and I2 are not coincident, and these circuits can conduct a static operation. The circuits shown in FIGS. 7A and 7B have the merit that the number of elements is small. However, it is more advantageous to employ the static circuits shown in FIGS. 12 to 15 for those circuits which have a low operation frequency, or which have a low frequency of operation (the number of times of use) and have to keep the output level for a long time.

That is, the circuits shown in FIGS. 7A and 7B hold the previous data as the output changes to the high impedance state when any discrepancy occurs in the input. When a slight OFF current exists, however, the output of the error pulse eliminating circuit changes gradually. No problems occurs in this instance if the clock cycle is sufficiently short with respect to the change time of the output but in the case where a long clock cycle is anticipated, too, the OFF current might result in the error operation.

Figure 12A:
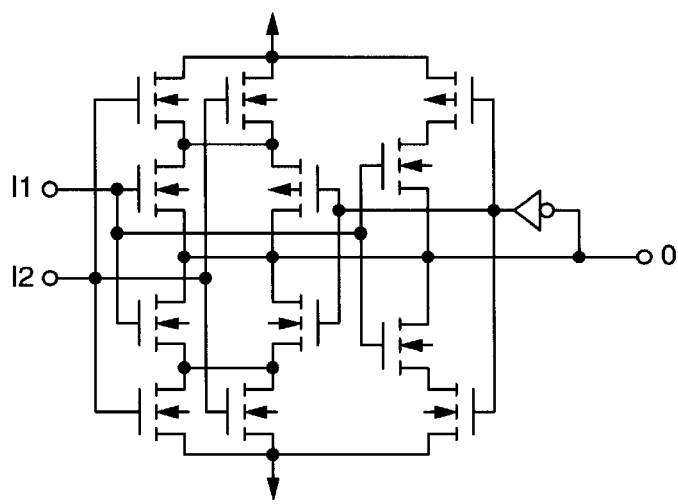
FIGS. 12A and 12B are circuit diagrams showing a concrete example of an error pulse eliminating circuit constituting the α-ray assurance flip-flop circuit according to the present invention, respectively.
Figure 12B:
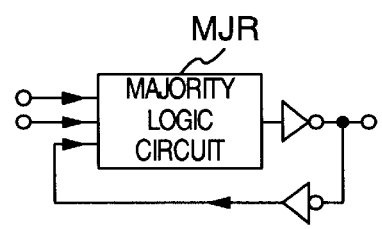
Figure 13A:
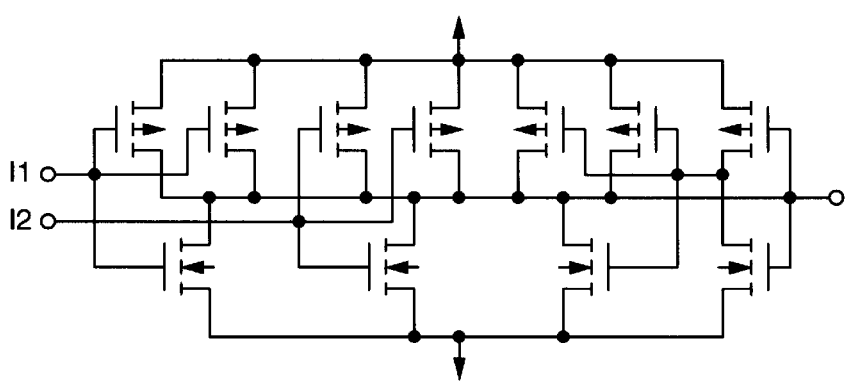
FIGS. 13A and 13B are circuit diagrams showing another concrete example of an error pulse eliminating circuit constituting the α-ray assurance flip-flop circuit according to the present invention, respectively.
Figure 13B:
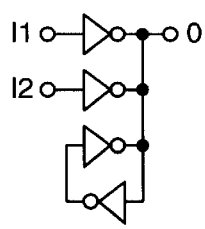
Figure 14A:
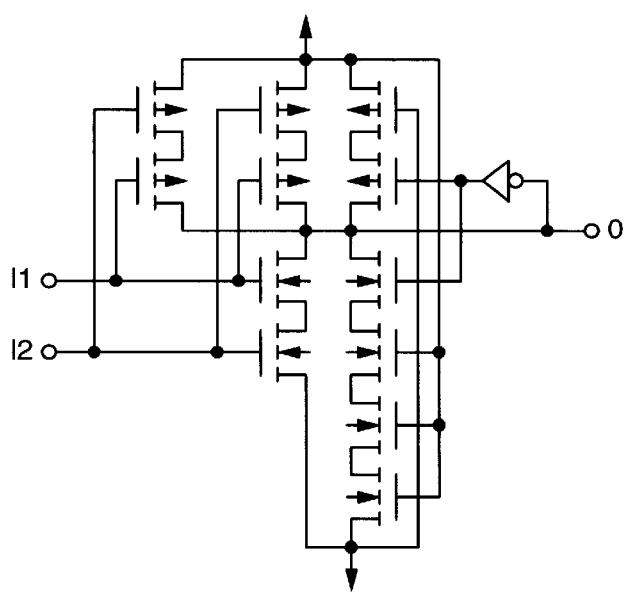
FIGS. 14A and 14B are circuit diagrams showing another concrete example of an error pulse eliminating circuit constituting the α-ray assurance flip-flop circuit according to the present invention, respectively.
Figure 14B:
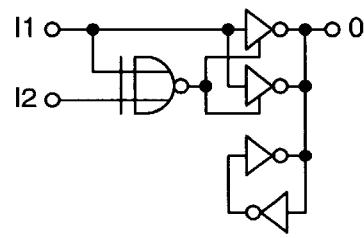
Figure 15A:
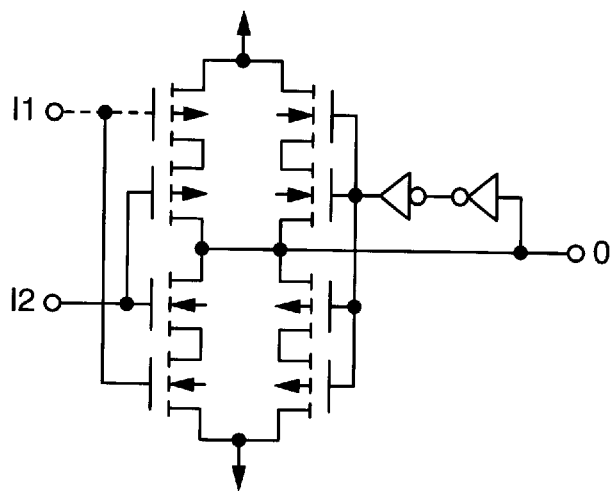
FIGS. 15A and 15B are circuit diagrams showing still another concrete example of an error eliminating circuit constituting the α-ray assurance flip-flop circuit according to the present invention, respectively.
Figure 15B:
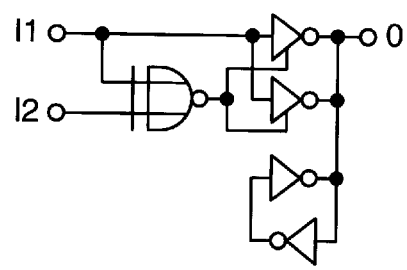

In contrast, the circuits shown in FIGS. 12 to 15 have a feedback path as can be understood more easily from FIG. 12B, and are so constituted as to output the just previous output signal when only one of the two input signals changes. In this way, the drawback of the dynamic operation of the circuits shown in FIGS. 7A and 7B can be eliminated. Since the circuits shown in FIGS. 12 to 15 employ the circuit system that outputs the signal generated by inverting the input signal, one stage of inverter may well be connected to the output terminal of the circuits shown in FIGS. 12 to 15 when it is desired to output the signal having the same phase as that of the input signal. When the two input signals are differential signals and the noise having the same phase is to be removed from them, an inverter may well be added to the pre-stage of one of the input terminals of the circuits shown in FIGS. 12 to 15.

Figure 10:
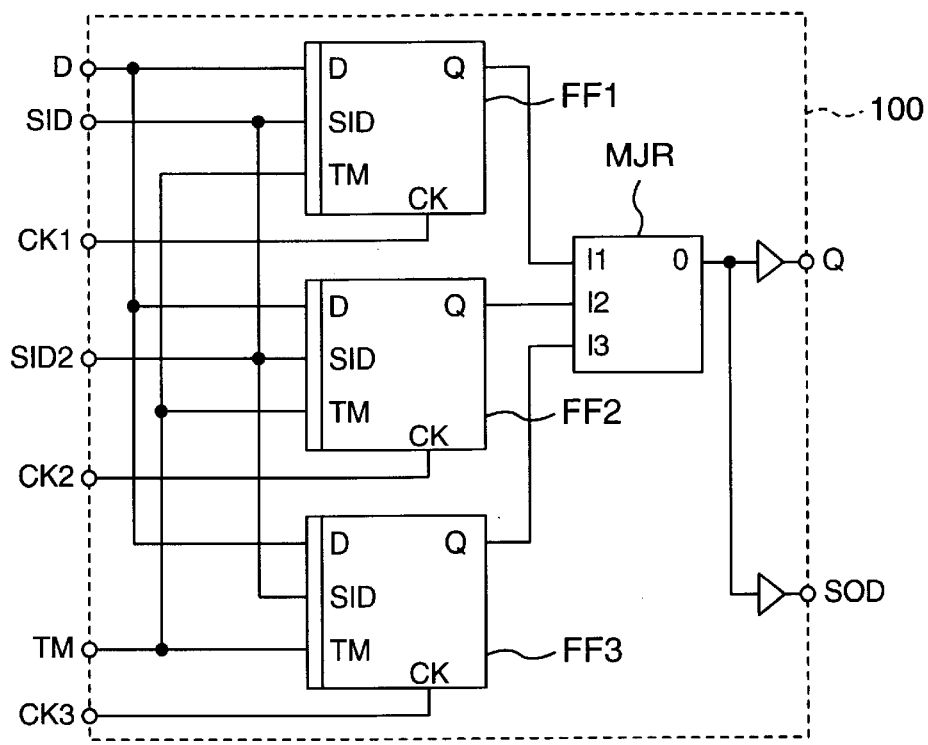
FIG. 10 is a structural circuit diagram showing an α-ray assurance flip-flop circuit according to a fifth embodiment of the present invention.

FIG. 10 shows an α-ray assurance flip-flop circuit 100 according to the fifth embodiment of the present invention. In this embodiment, the input terminal SID of the scan-in data for the flip-flops FF1 to FF3 in the flip-flop circuit 100 shown in FIG. 8 is used in common to decrease the number of input terminals by 2. In addition, the scan-out data terminals of the flip-flops FF1 to FF3 are eliminated and the output of the majority logic circuit MJR is instead constituted in such a fashion as to output the output of the majority logic circuit MJR to the scan-out data output terminal SOD. In this way, it is possible to decrease the number of output terminals by 2. In the flip-flop of this embodiment, the test of the flip-flops FF1 to FF3 and of the majority logic circuit MJT becomes incomplete. Nonetheless, since the number of scan data is reduced to ⅓, the test of the general logic in the flip-flop circuit 100 can be executed within a short time.

Figure 11:
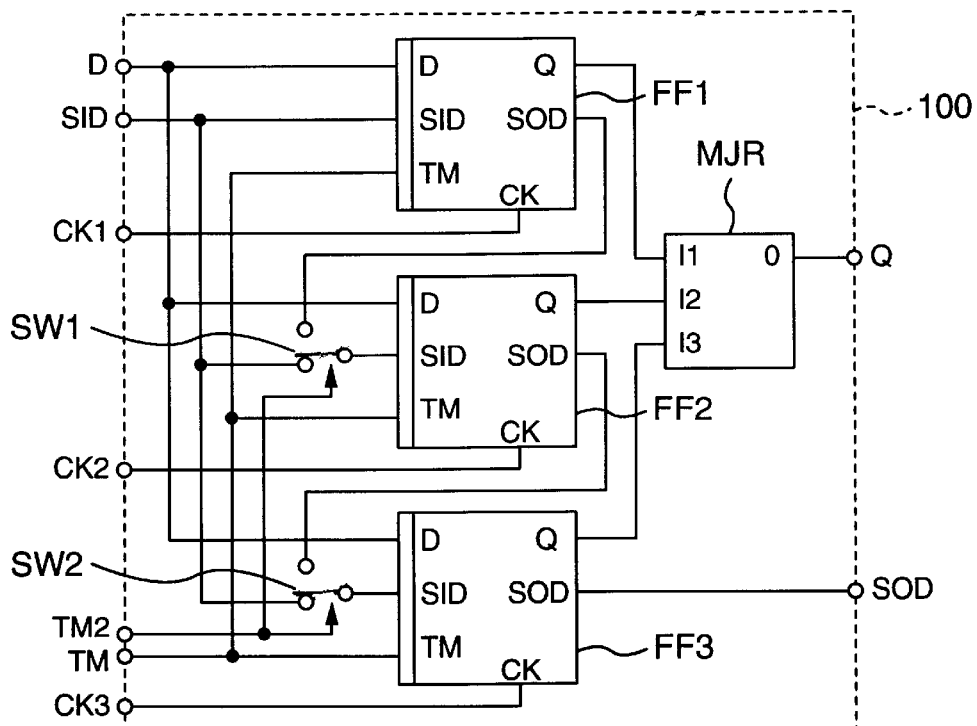
FIG. 11 is a structural circuit diagram showing an α-ray assurance flip-flop circuit according to a sixth embodiment of the present invention.

FIG. 11 shows an α-ray assurance flip-flop circuit 100 according to the sixth embodiment of the present invention. In this embodiment, switches SW1 and SW2 are disposed in front of the input terminals SID of the scan-in data of FF2 and FF3 of the flip-flops FF1 to FF3 in the flip-flop circuit 100 shown in FIG. 8. When these switches SW1 and SW2 are controlled by a testing control signal TM2, it becomes possible to reduce the number of input terminals by 1 and the number of output terminals of the scan-out data by 2 to one output terminal SOD.

In the flip-flop of this embodiment, the switches SW1 and SW2 are connected to the scan-in data input terminal side SUD as shown in FIG. 11 so that the scan-in data can be acquired by the flip-flops FF1 to FF3 and can be supplied to a logic circuit of the post-stage to be tested, through the majority logic circuit MJR. In this instance, the test of the flip-flops FF1 to FF3 and of the majority logic circuit MJR becomes incomplete. However, since the number of the scan data becomes ⅓ in comparison with the embodiment shown in FIG. 8, the test of the general logic in the flip-flop circuit 100 can be conducted within a short time.

When the switches SW1 and SW2 are switched to the opposite side to FIG. 11, the flip-flops FF1 to FF3 are connected in series to constitute a shift register. When the test data is inputted from the input terminal SID of the scan-in data and is outputted from the output terminal SOD of the scan-out data, it is possible to test whether or not the flip-flops FF1 to FF3 operate normally, and whether or not the majority logic circuit MJR operates normally by inputting separate data to the flip-flops FF1 to FF3. According to this embodiment, further, the number of signal lines of the scan paths formed on the chip of the semiconductor integrated circuit can be decreased in comparison with the embodiment shown in FIG. 8.

The embodiment shown in FIG. 11 may be modified by changing the number of flip-flops to 2, omitting the majority logic circuit MJR and disposing the error pulse eliminating circuit EPC in the post-stage of the flip-flops in the same way as the embodiment shown in FIG. 3 that is formed by changing the number of flip-flops to 2, omitting the majority logic circuit MJR and disposing the error pulse eliminating circuit EPC in the post-stage of the flip-flops with respect to the embodiment shown in FIG. 1. Besides the error pulse eliminating circuits EPC shown in FIGS. 7A and 7B, it is also possible to use those circuits which are shown in FIGS. 12 to 15.

Figure 16:
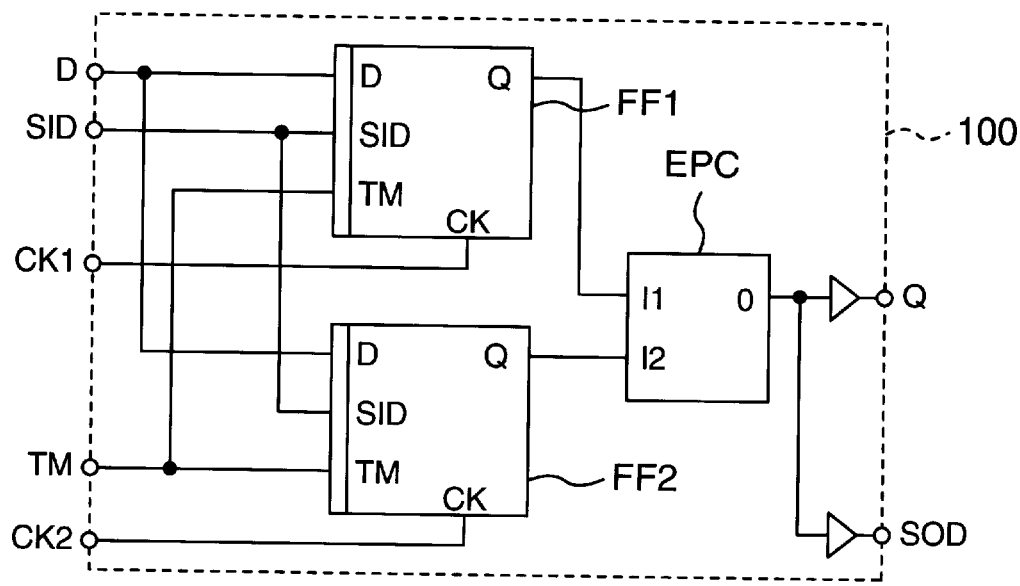
FIG. 16 is a structural circuit diagram showing an α-ray assurance flip-flop circuit according to a seventh embodiment of the present invention.
Figure 17:
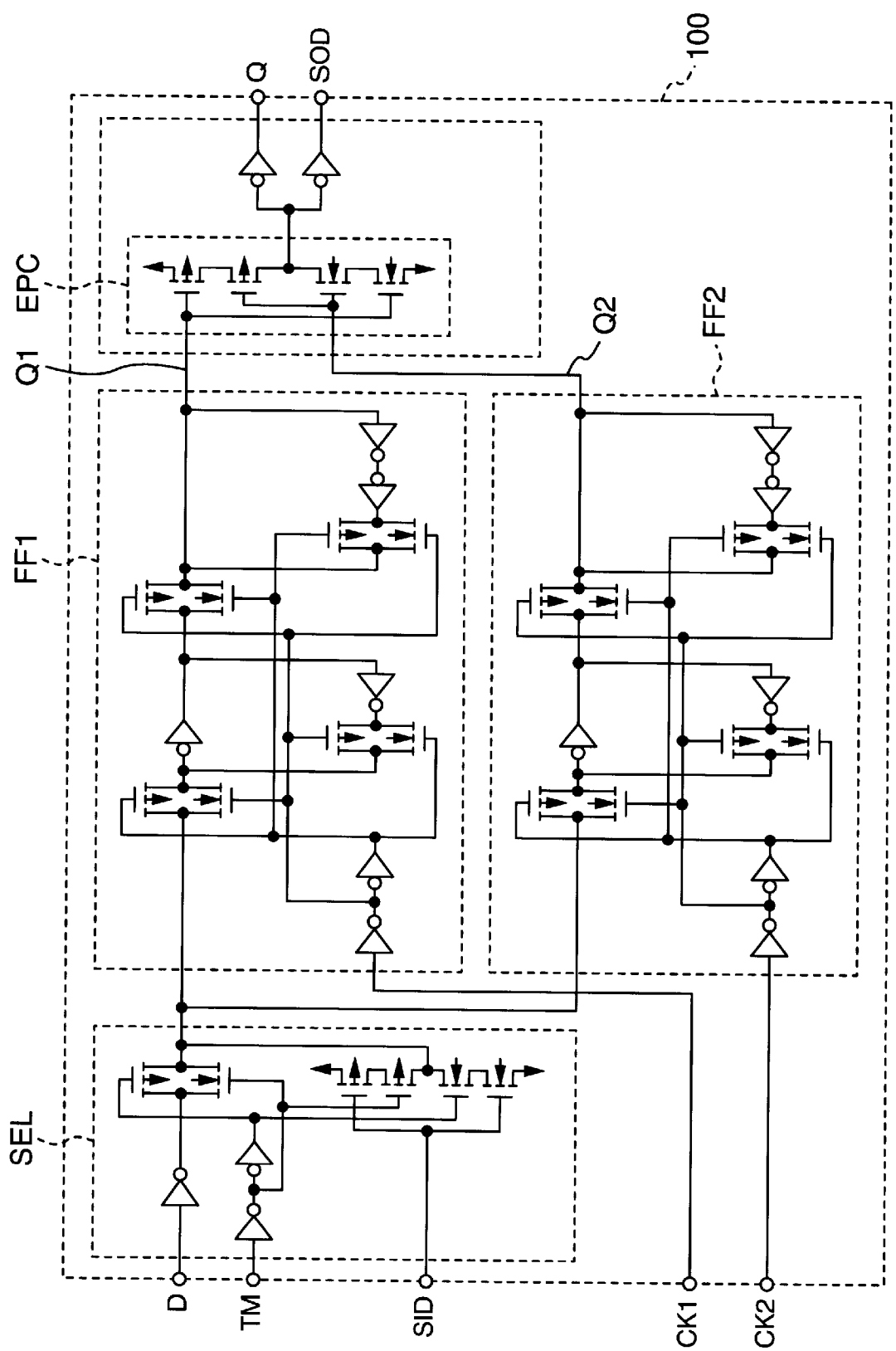
FIG. 17 is a circuit diagram showing a concrete circuit example of the α-ray assurance flip-flop circuit shown in FIG. 16.

FIG. 16 shows an α-ray assurance flip-flop circuit 100 according to the seventh embodiment of the present invention and FIG. 17 shows its concrete circuit example. In this embodiment, the embodiment shown in FIG. 10 is modified by changing the number of flip-flops to 2, omitting the majority logic circuit MJR and disposing the error pulse eliminating circuit EPC in the post stage of the flip-flops in the same way as the embodiment shown in FIG. 3 formed by modifying the embodiment shown in FIG. 1 by changing the number of flip-flops to 2, omitting the majority logic circuit MJR and disposing the error pulse eliminating circuit EPC in the post stage of the flip-flops.

The circuit shown in FIG. 17 includes the flip-flops shown in FIG. 5C and the error pulse eliminating circuit EPC shown in FIG. 7A, and a selector circuit SEL for acquiring the data signal D or the scan-in data SID in accordance with the test control signal TM is disposed in the pre-stage of the flip-flops FF1 and FF2. Besides the circuit shown in FIG. 17, it is possible to employ the circuits shown in FIGS. 7B and 12 to 15 for the error pulse eliminating circuit EPC.

Figure 18:
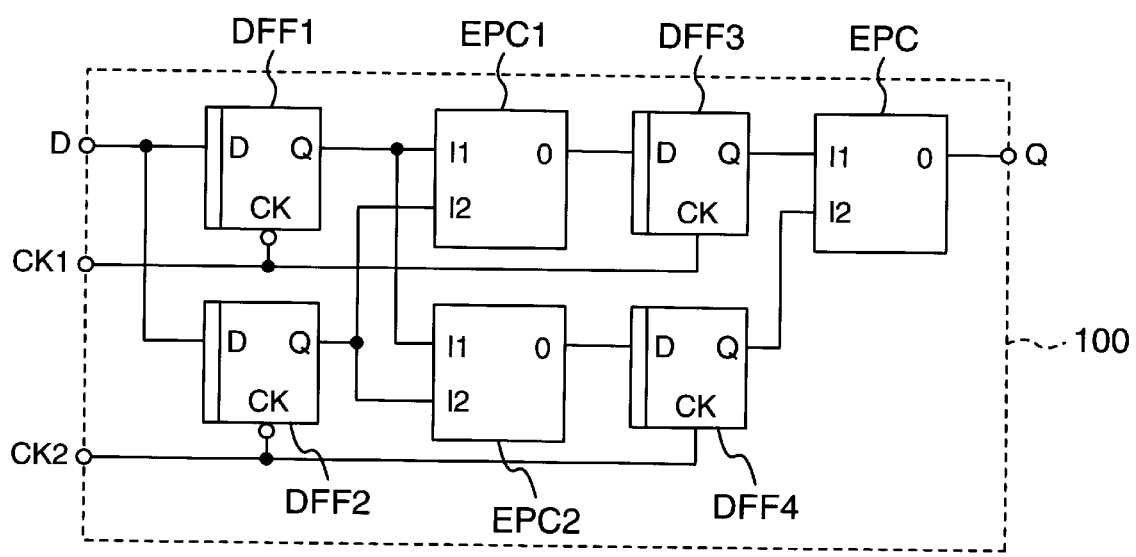
FIG. 18 is a structural circuit diagram showing an α-ray assurance flip-flop circuit according to an eighth embodiment of the present invention.
Figure 19:
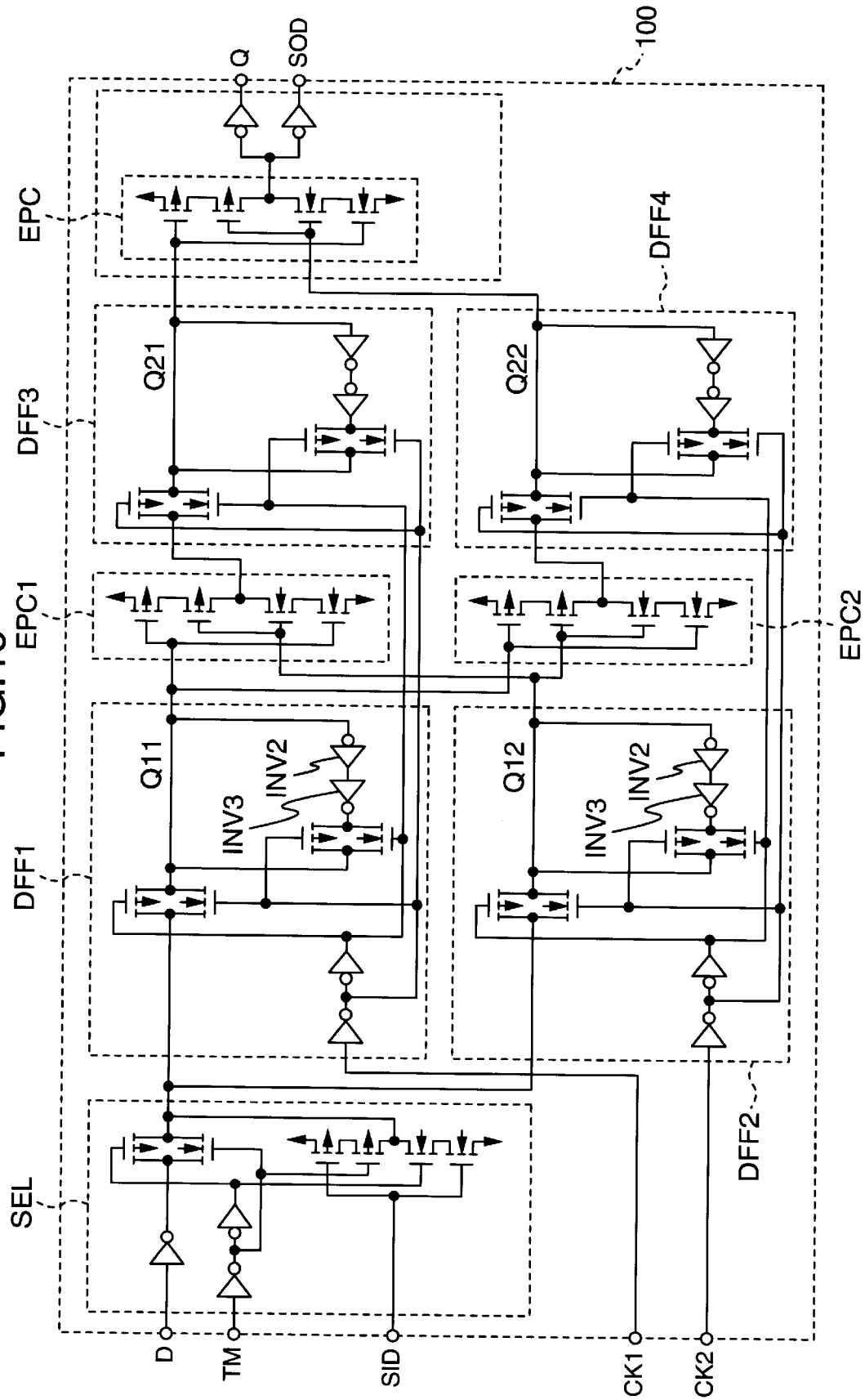
FIG. 19 is a circuit diagram showing a concrete circuit example of the α-ray assurance flip-flop circuit shown in FIG. 18.

FIG. 18 shows an α-ray assurance flip-flop circuit 100 according to the eighth embodiment of the present invention and FIG. 19 shows its concrete circuit example. This embodiment uses flip-flops DFF1 and DFF2 in place of the flip-flops FF1 and FF2 in the embodiment shown in FIG. 3A, and includes error pulse eliminating circuits EPC1 and EPC2 for inputting the outputs Q1 and Q2 of these flip-flops DFF1 and DGF2, disposed in the post stage of them, and second flip-flops DFF3 and DFF4 disposed in the post stage of the error pulse eliminating circuits EPC1 and EPC2, respectively, so that the outputs Q3 and Q4 of the flip-flops DFF3 and DFF4 are inputted to the error pulse eliminating circuit EPC. Clocks CK1 and CK2 operate these flip-flops DFF1 and DFF2, and FF3 and FF4 operate in the opposite phase to FF1 and FF2.

In the concrete circuit shown in FIG. 19, a selector circuit SEL for acquiring the data signal D or the scan-in data SID in accordance with the test control signal TM is disposed in the pre-stage of the flip-flops DFF1 and DFF2 in the same way as in the embodiment shown in FIG. 17. The flip-flops FF1 to FF3 latch the data at the rise of the clock input CK whereas the flip-flops DFF1 to DFF4 switch the through-operation or hold-operation depending on the value of the clock input CK.

Figure 20:
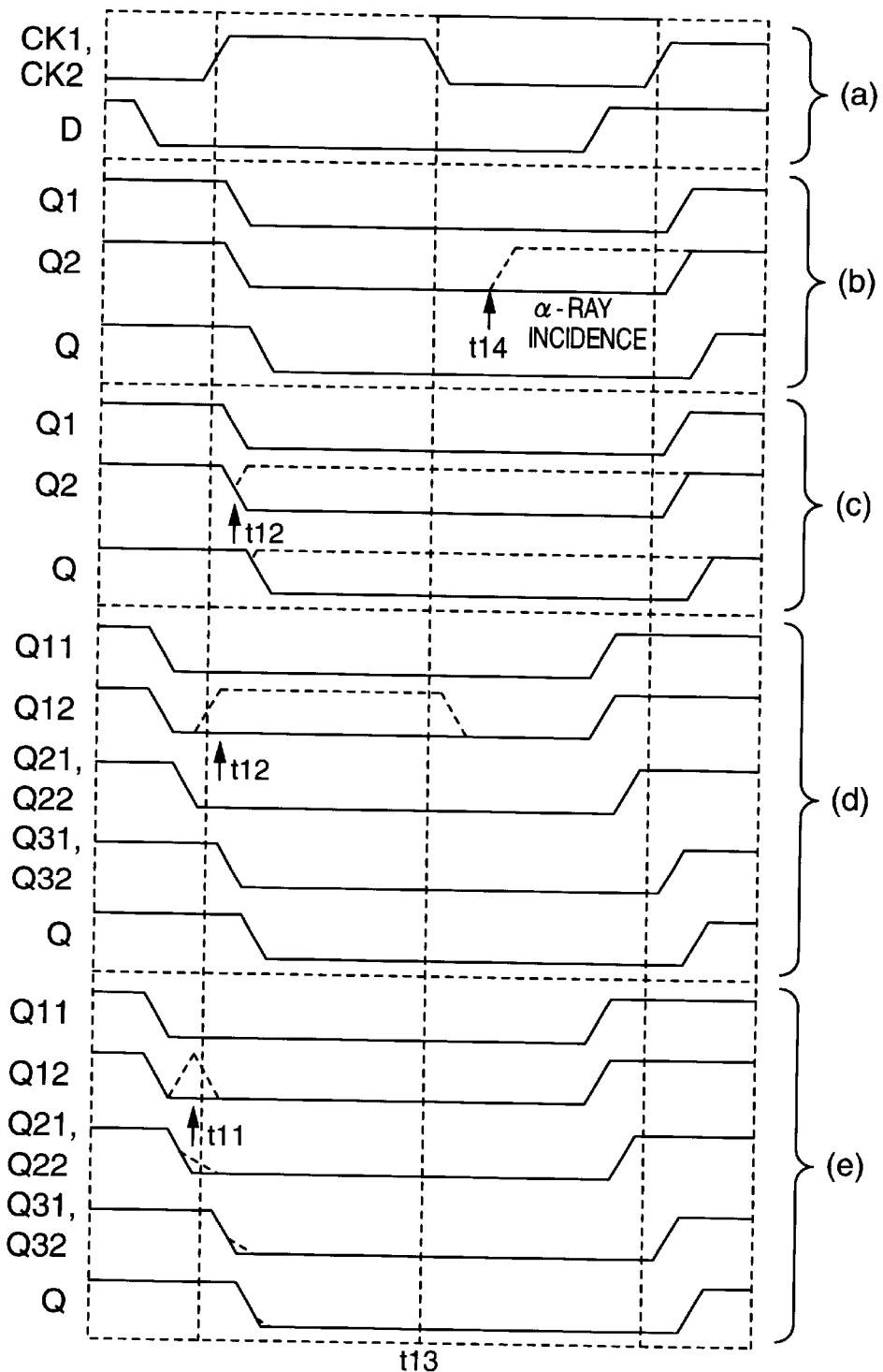
FIG. 20 is a waveform diagram showing an operation waveforms of signals of the α-ray assurance flip-flop circuit shown in FIG. 19.

According to the embodiment shown in FIGS. 18 and 19, the error operation due to the α-rays occurs more difficultly than in the circuit shown in FIG. 3A. The reason will be explained with reference to the timing chart of FIG. 20. In FIG. 20, (a) represents waveforms of the clocks CK1 and CK2 as the input signals and the data signal D. FIGS. 20(b) and 20(c) represent the output waveform of FF due to the operation of the error pulse eliminating circuit EPC when the α-rays pass through the flip-flop FF2 in the circuit shown in FIG. 3A. FIGS. 20(d) and 20(e) represent the output waveform of FF due to the operation of the error pulse eliminating circuit EPC when the α-rays pass through the flip-flop FF2 in the circuit shown in FIG. 18.

As described already, the output of the error pulse eliminating circuit EPC changes only when the two input signals change in the same way. Therefore, when the α-rays pass through the flip-flop FF2 at the timing t14 of FIG. 20(b) in the circuit shown in FIG. 3, for example, only one of the input signals of the error pulse eliminating circuit EPC of the next stage changes. Therefore, the output does not change and the error pulse is eliminated.

Next, it will be assumed in the circuit shown in FIG. 3 that the α-rays pass through the flip-flop FF2 at the change timing of the clock CK2 such as t12 of FIG. 20(c). At this time, the output Q2 of the flip-flop FF2 may not be inverted due to the influences of the α-rays. Then, since only one of the input signals of the error pulse eliminating circuit EPC of the next stage changes, the output does not change but remains at the high level as represented by dotted line though it should change to the low level. In consequence, the error pulse eliminating circuit EPC cannot normally transmit the change of the input signal, and may cause the error operation.

In contrast, in the circuit shown in FIG. 18, the error pulse eliminating circuits EPC1 and EPC2 are disposed immediately after the flip-flops DFF1 and DFF2 of the preceding stage. Therefore, the change of the input to the additional error pulse eliminating circuits EPC1 and EPC2, that is, the change of the outputs Q11 and Q12 of the flip-flops DFF1 and DFF2 at the normal time, can be designed to be a little faster than the change timing of the clocks CK1 and CK2 as shown in FIG. 20(d).

Therefore, let's consider the case where the α-rays pass through the flip-flop DFF2 at the change timing of the clock CK2 of t12 in FIG. 20(c). At this time, the output Q2 of the flip-flop DFF2 has already finished changing, and the phenomenon in FIG. 3 in which the output Q2 of FF2, should originally be inverted is not inverted, does not occur. Therefore, when the α-rays pass through the flip-flop FF2 at the timing t12, the output does not change and the error pulse can be eliminated even when the output Q2 of FF2 is inverted as represented by dotted line in FIG. 20(d) because only one of the input signals changes with respect to the error pulse eliminating circuit EPC of the next stage.

Incidentally, the reason why design can be made so that the timing of the normal change for the error pulse eliminating circuits EPC1 and EPC2 becomes a litter faster is as follows. Since the error pulse eliminating circuit EPC1 and EPC2 are disposed immediately after the flip-flops DFF1 and DFF2 that enter the data-through state when the clocks CK1 and CK2 are at the low level, a margin must be secured from the change timing of the outputs Q11 and Q12 of DFF1 and DFF2 to the rise of the clocks CK1 and CK2. When this margin is not secured, on the contrary, the change of the outputs of the error pulse eliminating circuits EPC1 and EPC2 becomes slower than the rise of the clocks CK1 and CK2 with the result that the flip-flops DFF3 and DFF4 of the subsequent stage is likely to fail to acquire the change of the outputs of the error pulse eliminating circuits EPC1 and EPC2. Such an adjustment of the timing can be conducted by setting the cycles of the clocks CK1 and CK2, for example.

Here, it is possible to avoid the disadvantage that the output Q12 of the flip-flop FF2 is not inverted when the α-rays pass through the flip-flop FF2 at the change timing of the clock CK2 such as the timing t12 of FIG. 20(c). When the α-rays pass through the flip-flop FF2 at a timing a little earlier than this timing, however, there occurs the doubt if the output Q12 of the flip-flop FF2 is not inverted. However, when the α-rays pass through the flip-flop DFF2 at a timing a little earlier than the change timing t12 of the clock CK2 such as a timing t11 shown in FIG. 20(d), the output Q12 of DFF2 is allowed to return to the normal level within the short time by the input signal as shown in FIG. 20(d) because the flip-flop DFF2 is under the data-through state at this time. Therefore, the influences of the α-rays on the output Q are only a delay to a certain extent.

On the other hand, the data-through state and the data-hold state of the flip-flops DFF3 and DFF4 of the post-stage are deviated by a half cycle of the clocks CK1 and CK2 from those of DFF1 and DFF2. Therefore, even when the α-rays pass through the flip-flop DFF3 or DFF4 at the change timing of the clock CK2 such as the timing t12 in FIG. 20(c), the outputs Q21 and Q22 of DFF3 and DFF4 are allowed to return within a short time to the normal level by the input signal because DFF3 and DFF4 are under the data-through state, and the influence of the α-rays on the output Q does not exist. Even when the α-rays pass through the flip-flop DFF3 or DFF4 at the change timing of the clocks CK1 and CK2 to the low level such as the timing t13 in FIG. 20(a), the inputs to the DFF3 and DFF4, that is, the outputs Q11 and Q12 of the flip-flops FF1 and FF2 of the preceding stage, do not change. Therefore, the problem that the α-rays inhibit the inversion of the latch state does not occur, either.

Figure 21:
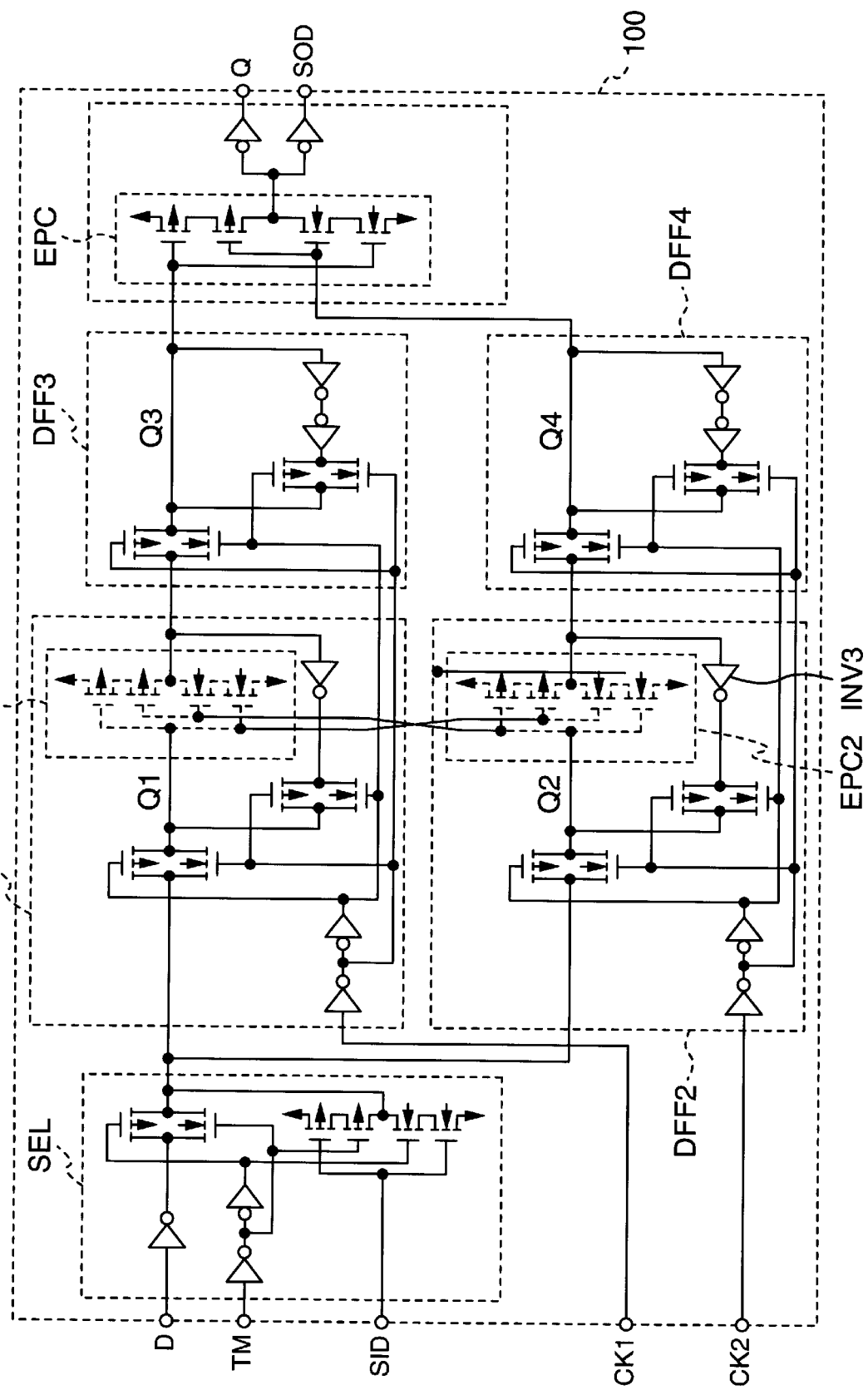
FIG. 21 is a circuit diagram showing another modified example of the α-ray assurance flip-flop circuit shown in FIG. 19.

FIG. 21 shows a modified example of the circuit shown in FIG. 19. In the circuit shown in FIG. 21, the error pulse eliminating circuits EPC1 and EPC2 are incorporated in the flip-flops DFF1 and DFF2 of the preceding stage, respectively, so that they operate in common as the inverter INV2 of the feedback loop constituting the latch. In comparison with the circuit shown in FIG. 19, therefore, the inverter INV2 inside the flip-flops DFF1 and DFF2 can be omitted, the number of components becomes smaller, and the circuit becomes smaller in scale and needs lower power, and an AC defect of the error pulse eliminating circuit itself can be detected more easily.

Figure 22:
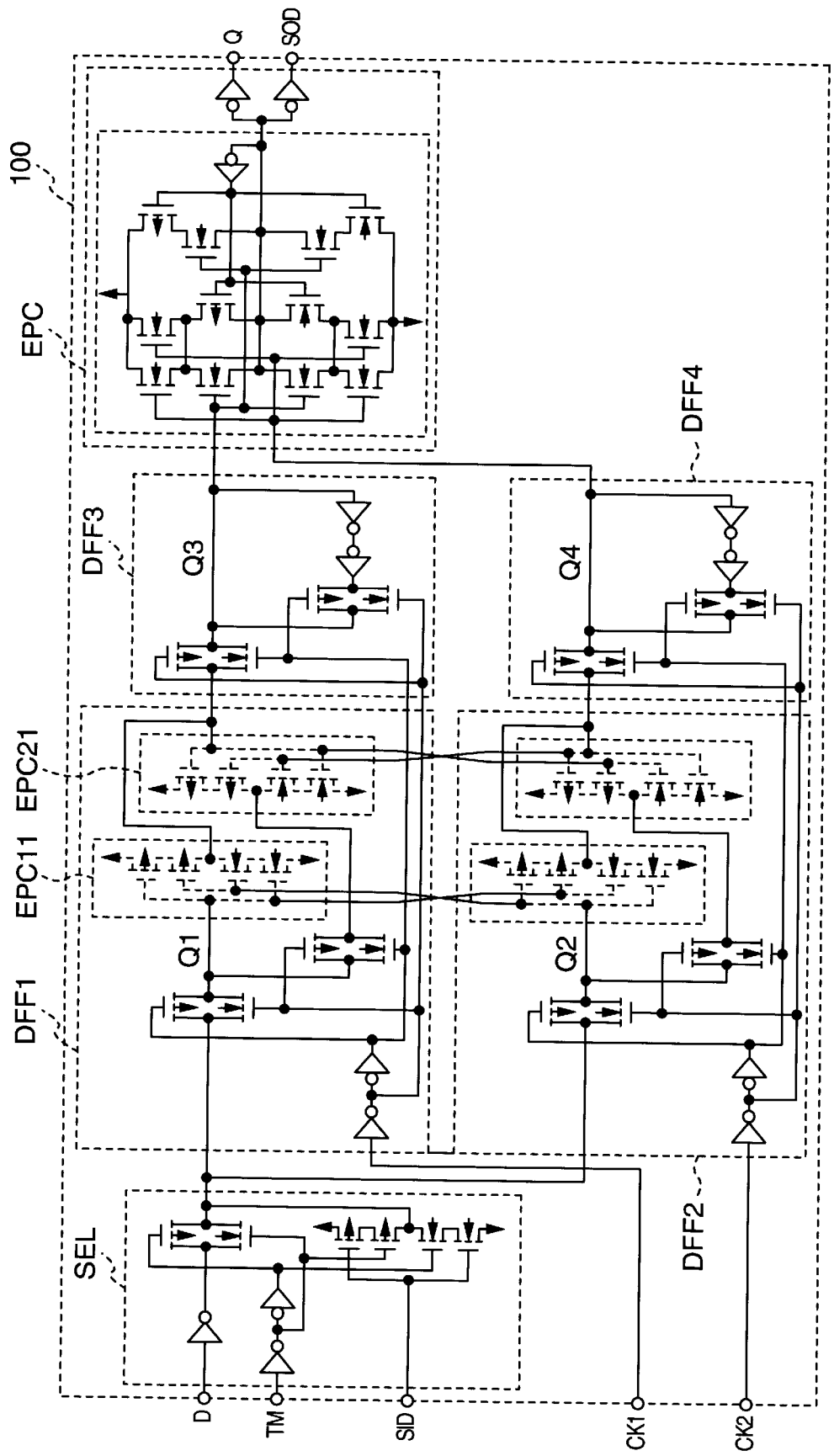
FIG. 22 is a circuit diagram showing still another modified example of the α-ray assurance flip-flop circuit shown in FIG. 19.

FIG. 22 shows a modified example of the circuit shown in FIG. 19. In the circuit shown in FIG. 22, the error pulse eliminating circuits EPC11, EPC12, EPC21 and EPC22 replace both inverters INV2 and INV3 of the feedback loop constituting the latch of the flip-flops DFF1 and DFF2 of the preceding stage in the circuit shown in FIG. 19. In consequence, though the circuit shown in FIG. 19 is a dynamic circuit, the circuit shown in FIG. 22 apparently operates as the static circuit as the cycle of the dynamic operation is shortened to eliminate the drawback of the circuit shown in FIG. 19.

The drawback of the dynamic circuit has already been explained with reference to the circuit of FIG. 7 in the error pulse eliminating circuit EPC used in the circuit shown in FIG. 19. The circuit shown in FIG. 7 keeps the just previous data by bringing the output to the high impedance state when any discrepancy occurs in the inputs. However, when a slight OFF current exists, the output of the error pulse eliminating circuit gradually changes. No problem occurs in this instance if the clock cycle is sufficiently short with respect to the change time of the output. When a longer clock cycle is assumed, however, such an OFF current may result in the error operation.

To easily suppress the influences described above, it is effective to use the circuit constructions shown in FIGS. 12 to 15 as the concrete construction of the error pulse eliminating circuit so that the output does not attain the high impedance state even when any discrepancy occurs in the inputs. However, the number of components of the circuits shown in FIGS. 12 to 15 is greater than that of the circuit shown in FIG. 7, and if the circuit is as such substituted, the increase of the area as well as power is unavoidable.

Figure 23:
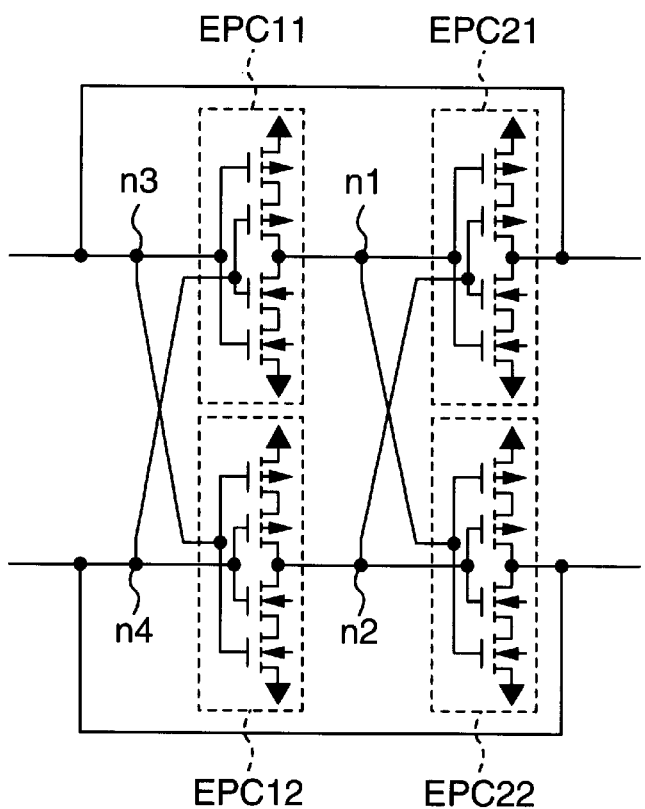
FIG. 23 is a circuit diagram showing principal portions of the α-ray assurance flip-flop circuit shown in FIG. 22.

In the embodiment shown in FIG. 22, the flip-flops DFF1 and DFF2 of the preceding stage can be equivalently regarded as the circuit shown in FIG. 23 under the hold state (CK=H). Referring to FIG. 23, it will be assumed that a node n1 is inverted by the α-rays to the high level when the data is held with nodes n1 and n2 being at the low level and nodes n3 and n4 being at the high level. The nodes n3 and n4 enter the high impedance state due to the error pulse eliminating circuit EPC3 and EPC4 and keep the just previous value, that is, the high level. Since both inputs to the error pulse eliminating circuit EPC1 are at the high level at this time, the node n1 immediately returns to the low level. When the node n1 returns to the low level, the output nodes of the error pulse eliminating circuits EPC3 and EPC4 enter the low impedance state and return to the original normal operation. The time till the return to the normal operation is substantially determined by the delay time of the feedback loop, and the influences of the temporary output change of the error pulse eliminating circuits EPC3 and EPC4 resulting from the slight OFF current can be eliminated irrespective of the clock cycle.

Figure 9:
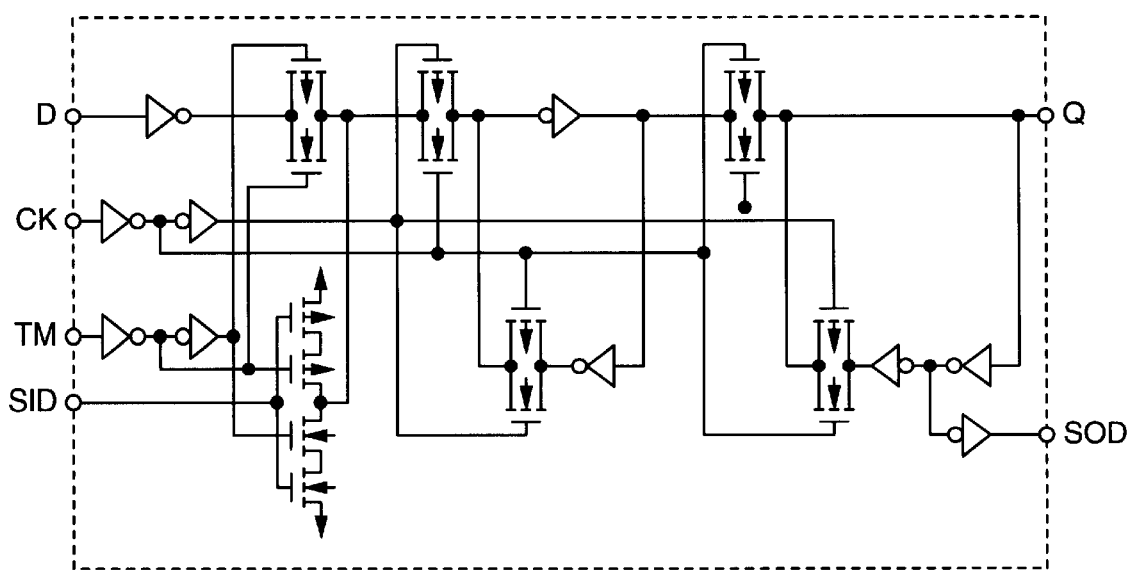
FIG. 9 is a circuit diagram showing a concrete example of a flip-flop having a scan test function and constituting an α-ray assurance flip-flop circuit according to the present invention.
Figure 25:
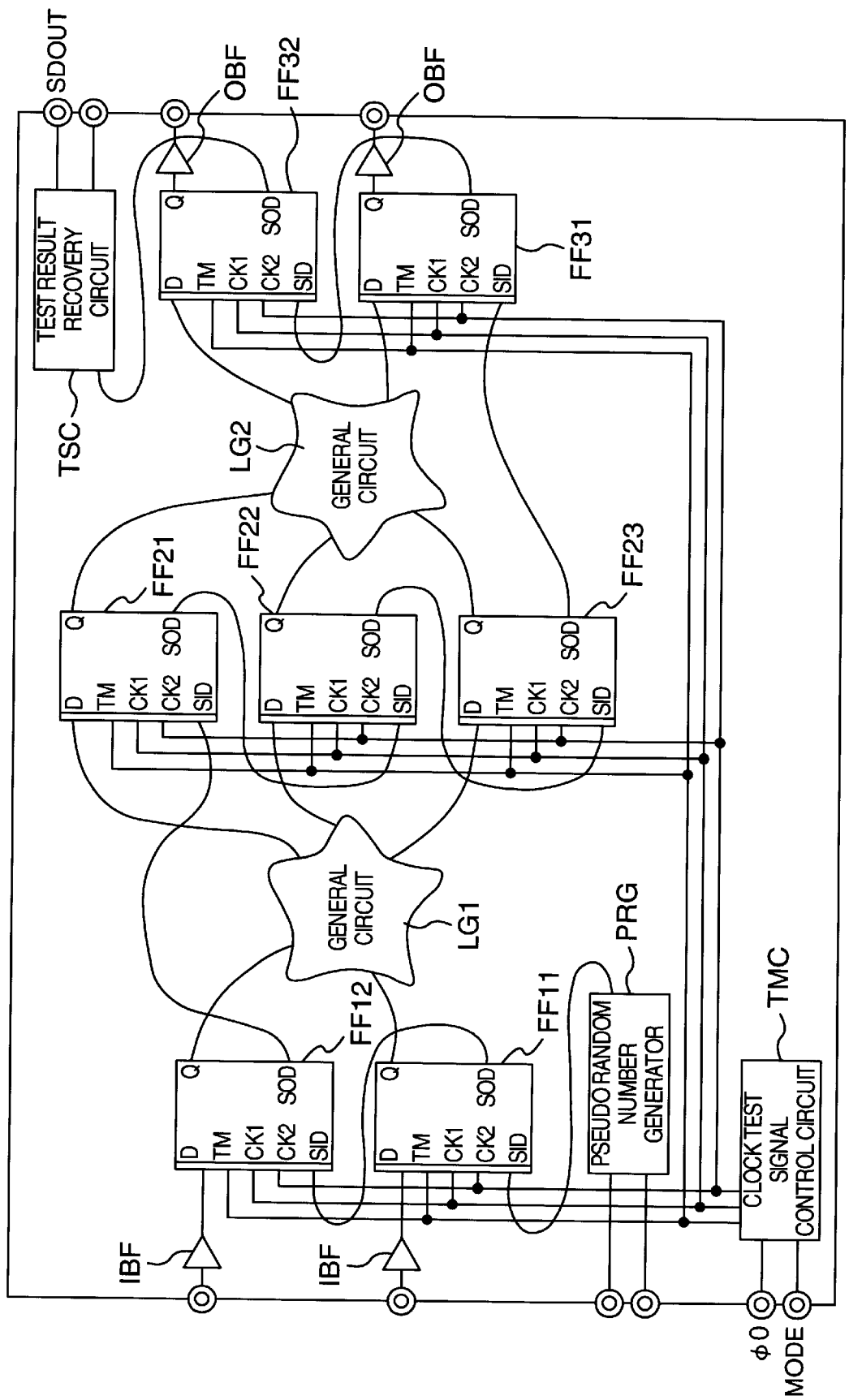
FIG. 25 is a structural circuit diagram showing a schematic construction of an LSI diagnosis circuit using a flip-flop having a scan test function.

FIG. 25 shows the relation between a general logic portion comprising random logics and combinational logics inside a logic LSI and flip-flops when test scan paths and shift registers for diagnosing internal logic circuits of the logic LSI are constituted by use of flip-flops equipped with the scan-in terminals and the scan-out terminals shown in FIGS. 8 and 9. In FIG. 25, two general logic portions LG1 and LG2 represent the internal logics for the sake of convenience of illustration. In order to have the description more easily understood, it will be assumed that signals are inputted from the left side of the drawing and are transferred to the right side and outputted therefrom. Incidentally, symbol IBF represents an input buffer circuit for acquiring the signals inputted during the normal operation and OBF does an output buffer circuit for outputting outside the signals outputted from the internal circuit during the normal operation.

In FIG. 25, two flip-flops FF11 and FF12 are arranged on the input side of the general logic portion LG1 and two flip-flops FF31 and FF32 are likewise arranged on the output side of the general logic portion LG2, too. Three flip-flops FF21, FF22 and FF23 are interposed between these general logic portions LG1 and LG2. These flip-flops FF11 to FF32 operate during the normal operation in such a fashion as to fetch the signals inputted to the data terminal D in synchronism with the clock signals CK1 and CK2 and to output them from the data output terminal Q to the general logic portions LG1 and LG2 of the next stage or to the external output terminals.

In the LSI so constituted as to possess the diagnosing function in FIG. 25, the flip-flops FF11 to FF32 connected before and after, and between, the general logic portions LG1 and LG2 are connected in series to constitute the shift register. In other words, the scan-in data terminal SID of each of these flip-flops FF11 to FF32 is connected to the scan-out data terminal SOD of the flip-flop of the preceding stage, and its scan-out data terminal SOD is connected to the scan-in data terminal of the flip-flop of the subsequent stage, thereby constituting the shift register. The signal inputted to the scan-in data terminal SID is fetched in synchronism with the clock signal CK1 or CK2 and is outputted from the scan-out data terminal SOD.

This embodiment includes a clock-test signal control circuit TMC for generating the clock signals CK1 and CK2 and the test control signal TM described above, a pseudo random number generator PRG for generating the test data that is scanned by the shift register during diagnosis, and a test result recovery circuit TSC for recovering the data transferred from the shift register and outputting it to the external terminal SDOUT. The clock-test signal control circuit TMC is so constituted as to generate the clock signals CK1 and CK2 and the test control signal TM on the basis of the reference clock φo and the test mode signal MODE supplied from an external tester, or the like.

When the α-ray assurance flip-flop circuit according to the present invention is applied to the logic integrated circuit described above, the α-ray assurance flip-flop circuit is constituted by those elements which belong to the smallest size group on the chip used for the general logic portions LG1 and LG2. In contrast, the input buffer circuit IBF and the output buffer circuit OBF are constituted by use of elements having relatively large sizes (for example, the gate width is 4 to 5 times the size of the former elements in MOSFET).

Next, the method of separately using the α-ray assurance flip-flop circuit and other flip-flops in the semiconductor integrated circuit will be explained. The degree of allowance of the error operation of the semiconductor integrated circuit varies depending on the application. The degree of allowance is generally stipulated as an FIT number (the number of times of allowable error operations per $10^9$ hr), and this FIT number includes the FIT number determined for a system and the FIT number determined for flip-flop circuits, RAM circuits, and so forth.

The FIT number must be zero (0) in a system or a circuit that cannot detect the error operation, in a system or circuit that cannot conduct error correction by duplexing the logic or by an ECC circuit, or in a system in which even a slight retry error renders a problem from the aspect of the speed, such as in a parallel computer. It is therefore effective to apply the data hold circuit consisting of the α-ray assurance flip-flops according to the present invention to those systems or circuits.

On the other hand, the existing semiconductor fabrication technology can reduce the FIT number by making contrivances to a package such as lowering of the degree of integration, arrangement of pads away from the circuits, use of wiring materials having a low impurity concentration, increase of the thickness of a protective film, and so forth. Such a technology can cope with a system or a circuit in which the FIT number of three digits is allowable, and the present invention need not be applied. Further, flip-flops to which the present invention is not applied can be used in a system or a circuit in which the FIT number of one to two digits is allowable and an error correction circuit can be disposed, or an error operation can be detected time-wise or a retry operation detection can be conducted or duplexing of logics is possible, in combination with contrivances of the package. On the contrary, it is effective to apply the data hold circuit consisting of the α-ray assurance flip-flops according to the present invention to the LSI of the on-chip bump structure in which bonding bumps are formed at the center of the chip, and requiring a small FIT number because the bump material itself serves as the α-ray generation source.

It is also effective to apply the data hold circuit consisting of the α-ray assurance flip-flops according to the present invention to those systems or circuits in which the FIT number of one to two digits is allowable but in which the error correction circuit cannot be arranged easily or in which detection of the error operation and the retry operation or duplexing of the logic is difficult to attain. When the present invention is applied, too, it is possible to positively put capacitances to the nodes inside the flip-flops or to conjointly use a high multiplying technology for improving driving force by connecting a plurality of inverters in parallel. Furthermore, the combination of the technologies described above may be applied on one chip in accordance with the FIT number required for the circuit.

In elements such as SRAM, the requirement for the FIT number "0" is satisfied by increasing the capacitances of the nodes inside the memory cells or by disposing the error correction circuit. Here, the present invention can be regarded as the error correction circuit in SRAM, or the like, in a broader sense of the word, but the present invention is primarily directed to the flip-flop circuits that are used for the general logic. Unlike the error correction circuit such as SRAM, the present invention has the advantage that it can obtain the output without a substantial delay. Therefore, in the LSI in which RAM and the logic circuits are mounted onto one chip, the assurance technology by using the error correction circuit is employed for the RAM portion while the technology of the present invention is employed for the logic circuit portion.

Figure 26:
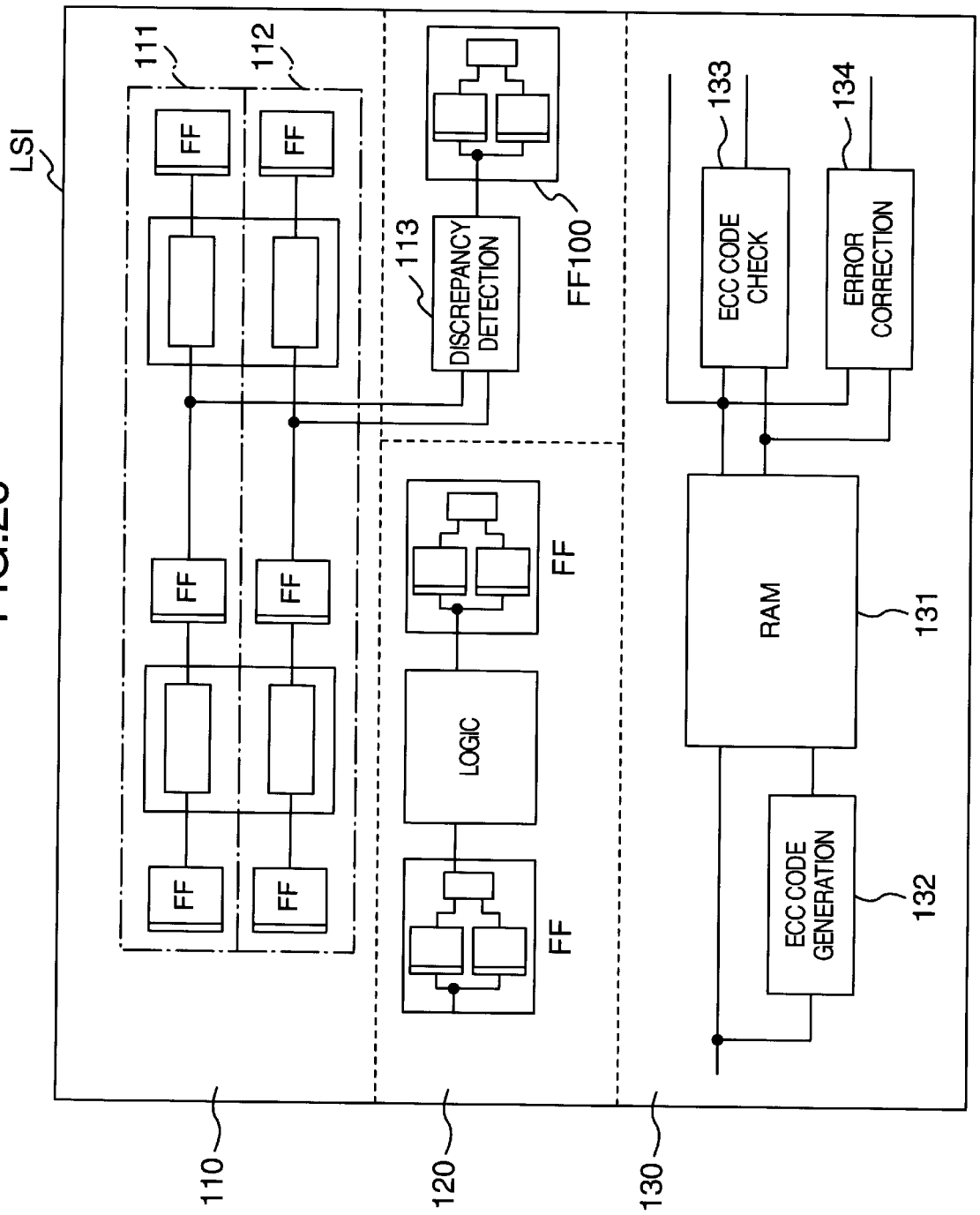
FIG. 26 is a block diagram showing an example of an LSI to which a designing method of a semiconductor device according to the present invention can be suitably applied.

FIG. 26 shows an example of an LSI using the conventional α-ray assurance technology in combination with the α-ray assurance technology according to the present invention. In the drawing, reference numeral 110 denotes a logic portion to which the conventional logic duplexing technology is applied. The logic portion 110 includes a first logic circuit 111 and a second logic circuit 112 that execute the same logical operation with each other. The LSI includes a discrepancy detection circuit for detecting whether or not the logical outputs of these logic circuits 111 and 112 are coincident. Detecting discrepancy, this detection circuit 113 outputs a detection signal, and a retry processing for executing once again the same logic operation is executed in some cases.

Reference numeral 120 in FIG. 26 denotes a logic portion to which the α-ray assurance technology of the present invention is applied, and this logic portion 120 uses the α-ray assurance flip-flops explained in the foregoing embodiments as the flip-flops constituting the logic. The detection signal outputted from the discrepancy detection circuit 113 is an important signal from the aspect of system reliability. Therefore, it is preferred to use the α-ray assurance flip-flops explained in the foregoing embodiments for the flip-flop FF100 for holding the detection signal outputted from the discrepancy detection circuit 113.

Reference numeral 130 denotes a memory portion inclusive of an RAM. An ECC code generation circuit 132 for generating an ECC code is arranged on the input side of the RAM 131. An ECC code check circuit 133 for checking whether or not the ECC code is correct and an error correction circuit 134 for correcting the error when the ECC code is erroneous are arranged on the output side of the RAM 131. Incidentally, the size of the elements constituting the memory cells contained in the RAM is generally smaller than the size of the elements constituting the flip-flop circuit.

Figure 27:
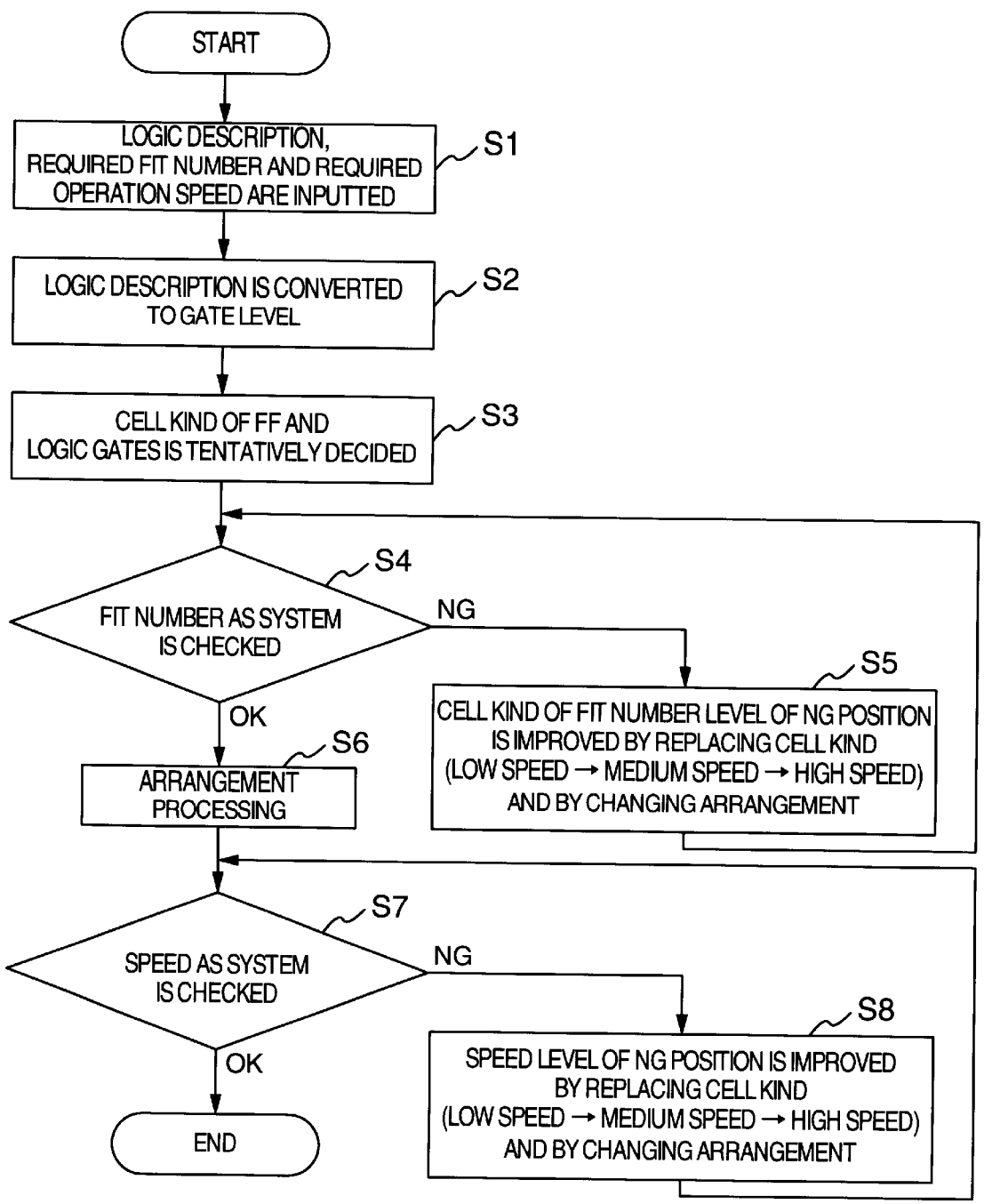
FIG. 27 is a flowchart showing an example of a concrete procedure of a designing method of a semiconductor device according to the present invention.

In the logic portion 120 to which the α-ray assurance technology of the present invention is applied, it is not always necessary to use the α-ray assurance flip-flop for all the flip-flops FF constituting the logic. In other words, the flip-flops may be used separately in accordance with the FIT number required for a predetermined circuit unit such as a circuit block. Next, a concrete designing method for separately using the α-ray assurance flip-flops of the present invention and other flip-flops will be explained with reference to the flowchart of FIG. 27.

In designing the LSI according to the present invention, the specification of the LSI such as the FIT number required for the logic design data described by a HDL (Hardware Description Language) and for the overall system (LSI), the required operation speed, the power source voltages used, power consumption, and so forth, is inputted (Step S1). In the description of the logic by the HDL, the FIT number may be designated or described for a predetermined functional circuit block or for each flip-flop or each logic gate constituting the functional circuit block. In the next step S2, the logic description is converted to design data of the gate level by use of a logic synthesis tool offered by an ED vendor, or the like.

Next, the kind of cells to be used is selected from a cell library prepared in advance as database and is provisionally decided in consideration, and on the basis, of the FIT number required for the process used and for the overall system, the operation speed and the FIT number level required for each circuit block or flip-flop and logic gates (Step S3). At this time, the level of the FIT number may be changed for each flip-flop in the same circuit block. To the cell library are registered in advance the multiplexing data hold circuit of the embodiment shown in FIGS. 1 and 2, the duplexing data hold circuit of the embodiment shown in FIG. 3, a data hold circuit with capacitance in which the capacitance is positively applied to internal nodes, a high multiplying type data hold circuit that improves the driving force by connecting a plurality of inverters in parallel, and a data hold circuit consisting of only elements of the smallest size, and a suitable circuit may be selected among them.

In the case of frequency division counters of a PLL circuit, for example, a counter having a high FIT number and a high operation speed is required for a counter of the preceding stage because the error operation of the counter of preceding stages to a certain extent does not much affect accuracy of the output frequency but a counter having a low FIT number, though the operation speed is low, is required for the subsequent stage because the influence of the error operation on frequency accuracy becomes great. It is therefore preferred to use the α-ray assurance flip-flop of the foregoing embodiments for the flip-flops constituting the frequency division counters of the subsequent stages in the PLL circuit.

Incidentally, the kind of cells used is determined by selecting the high FIT number as the level of the FIT number and the low speed as the speed level unless particularly specified otherwise. To apply the designing method of the present invention, the information of the FIT number of the cells is put in advance to the information column of the cells registered to the cell library.

Next, whether or not the FIT number as the overall system using the flip-flops and logic gates so decided satisfies the requirement is judged (Step S4). When the result proves NO, the flow proceeds to Step S5, and the level of the FIT number of the position at which the requirement is not satisfied is improved by replacing the kind of cells used or by multiplexing the logic.

The flow then returns to Step S4 and whether or not the FIT number of the overall system satisfies the requirement is judged. The processing described above is repeated until the requirement is satisfied. When the result proves YES, the flow proceeds to the layout processing S6 that arranges the flip-flops and the logic gates on the chip. Thereafter, whether or not the speed of the overall system satisfies the requirement is judged (Step S7). When the result proves NO, the flow proceeds to Step S8, and the speed level of the position at which the requirement is not satisfied is improved through the change of the kind of cells used and the change of the arrangement. The flow then returns to Step S6, and whether or not the speed of the overall system satisfies the requirement is judged. The processing described above is repeated until the requirement is satisfied. Design is finished when the requirement is satisfied.

The invention completed by the present inventors has thus been explained concretely on the basis of its embodiments. However, the present invention is in no way limited to these embodiments but can naturally be changed or modified in various ways without departing from its scope. For example, although the foregoing embodiments represent the flip-flop circuits constituted by use of the MOS transistors, particularly the CMOS circuits, the present invention can similarly use a flip-flop circuit including only n channel MOS transistors or bipolar transistors.

In the explanation given above, the invention completed by the present inventors has been explained primarily about the α-ray assurance flip-flop circuit as the background and field of the invention of the present invention, but the present invention can be used similarly for not only improving the α-ray resistance but also avoiding the error operation of the flip-flop circuit due to the noise.

The effects brought forth by the typical inventions among the inventions disclosed in this application are briefly as follows.

The present invention can prevent the error operation of the flip-flop circuit due to the α-rays even when the elements are miniaturized, but does not require to change the size of the elements or to design once again the capacitance even when the elements are miniaturized or when the power source voltage used changes. The present invention can ensure the α-ray resistance of the flip-flop circuit even when the threshold value of the MOS transistors is raised or when the power source voltage used becomes lower. Therefore, the present invention can reduce the standby current by increasing the threshold value of the MOS transistors, can detect more easily the fault by a leakage current test due to the decrease of the standby current, and can provide a low speed LSI by lowering the power source voltage when a smaller consumed current is preferred even when the operation frequency is low. In this way, the present invention can utilize LSI that has been discarded in the past as defectives.

What is claimed is:

1. A data hold circuit comprising:
   at least three flip-flop circuits for inputting the same signal; and
   a majority logic circuit for outputting a signal in accordance with a logic value of the majority of outputs of said at least three flip-flop circuits.

2. The data hold circuit according to claim 1, wherein said at least three flip-flop circuits are configured such that the same input signal is acquired on the basis of mutually different clock signals synchronized with one another.

3. The data hold circuit according to claim 2, wherein each of said at least three flip-flop circuits is a flip-flop circuit with a diagnosis function, having a scan-in terminal and a scan-out terminal for test data.

4. The data hold circuit according to claim 3, wherein two of said at least three flip-flop circuits have switch means for switching and inputting common scan-in data and the output from said scan-out terminal from the other flip-flop circuit, in a preceding stage of said scan-in terminal.

5. The data hold circuit according to claim 1, wherein two of said at least three flip-flop circuits acquire the same input signals on the basis of mutually different two clocks signals synchronized with each other, and the other one of said at least three flip-flop circuits uses said mutually different two clock signals as the input and acquires the input signal on the basis of an output signal of a logic circuit whose output changes in accordance with a normal change of said mutually different two clock signals.

6. The data hold circuit according to claim 5, wherein each of said at least three flip-flop circuits is a flip-flop circuit with a diagnosis function, having a scan-in terminal and a scan-out terminal for test data.

7. The data hold circuit according to claim 6, wherein two of said at least three flip-flop circuits have switch means for switching and inputting common scan-in data and the output from said scan-out terminal from the other flip-flop circuit, in a preceding stage of said scan-in terminal.

8. The data hold circuit according to claim 1, wherein each of said at least three flip-flop circuits is a flip-flop circuit with a diagnosis function, having a scan-in terminal and a scan-out terminal for test data.

9. The data hold circuit according to claim 8, wherein two of said at least three flip-flop circuits have switch means for switching and inputting common scan-in data and the output from said scan-out terminal from the other flip-flop circuit, in a preceding stage of said scan-in terminal.

10. A data hold circuit comprising:
two flip-flop circuits configured to be supplied with the same input signal on the basis of the same clock signal or mutually different clock signals synchronized with each other; and
a logic circuit whose output changes in accordance with a change of both output signals from said two flip-flop circuits in a same way.

11. The data hold circuit according to claim 10, wherein said logic circuit includes a first input, a second input and one output, a logic value of said output is equal to said first and second inputs when a logic value of said first input is equal to that of said second input, and the logic value of said output is equal to a logic value of a just previous output when the logic value of said first input is different from that of said second input.

12. The data hold circuit according to claim 11, wherein said two flip-flop circuits are a flip-flop circuit with a diagnosis function, having a scan-in terminal and a scan-out terminal for test data.

13. The data hold circuit according to claim 10, wherein said logic circuit includes a first input, a second input and one output, a logic value of said output is an inversion value of said first and second inputs when a logic value of said first input is equal to that of said second input, and the logic value of said output is equal to a logic value of a just previous output when the logic value of said first input is different from that of said second input.

14. The data hold circuit according to claim 13, wherein said two flip-flop circuits are a flip-flop circuit with a diagnosis function, having a scan-in terminal and a scan-out terminal for test data.

15. The data hold circuit according to claim 10, wherein said logic circuit includes a first input, a second input and one output, a logic value of said output is equal to a logic value of a just previous output when a logic value of said first input is equal to that of said second input, and the logic value of said output is equal to the logic value of said first input when the logic value of said first input is different from that of said second input.

16. The data hold circuit according to claim 15, wherein said two flip-flop circuits are a flip-flop circuit with a diagnosis function, having a scan-in terminal and a scan-out terminal for test data.

17. The data hold circuit according to claim 10, wherein said logic circuit comprises a majority logic circuit having three inputs and one output and deciding an output thereof in accordance with at least two of said inputs, and said three inputs are outputs of said two flip-flop circuits and the output of said majority circuit.

18. The data hold circuit according to claim 17, wherein said two flip-flop circuits are a flip-flop circuit with a diagnosis function, having a scan-in terminal and a scan-out terminal for test data.

19. The data hold circuit according to claim 10, which further includes first and second differential circuits for outputting signals changing in accordance with a change of clock signals supplied as differential signals upon receiving said clock signals, and wherein said two flip-flop circuits acquire said inputs on the basis of the outputs of said first and second differential circuits, respectively.

20. The data hold circuit according to claim 19, wherein the outputs of said first and second differential circuits are equal to the logic value of either one of said block signals when the logic values of said differential clock signals inputted are mutually different, and are equal to a logic value of a just previous output when the logic values of said differential clock signals are equal.

21. The data hold circuit according to claim 20, wherein said two flip-flop circuits are a flip-flop circuit with a diagnosis function, having a scan-in terminal and a scan-out terminal for test data.

22. The data hold circuit according to claim 19, wherein said two flip-flop circuits are a flip-flop circuit with a diagnosis function, having a scan-in terminal and a scan-out terminal for test data.

23. The data hold circuit according to claim 10, wherein said flip-flop circuits are a flip-flop circuit with a diagnosis function, having a scan-in terminal and a scan-out terminal for test data.

24. A data hold circuit comprising:
first and second flip-flop circuits using the same signal as an input, and acquiring input signals on the basis of the same clock signal or mutually different clock signals synchronized with each other;
first and second logic circuits whose output changes in accordance with a normal change of the output signals of said first and second flip-flop circuits;
a third flip-flop circuit using the output signal of said first logic circuit as an input thereof
a fourth flip-flop circuit using the output signal of said second logic circuit as an input thereof; and
a third logic circuit whose output changes in accordance with a normal change of the output signals of said third and fourth flip-flop circuits;
wherein said first and second flip-flop circuits enter a data-through state in the first state of said clock signal and a data-hold state in the second state of said clock signal, and said third and fourth flip-flop circuits enter the data-hold state in the first state of said clock signal and the data-through state in the second state of said clock signal.

25. A semiconductor device comprising:
an internal circuit having at least three flip-flop circuits for inputting the same signal, and
a majority logic circuit for outputting a signal in accordance with a logic value of the majority of the outputs of said at least three flip-flop circuits, and constituted by MOS transistors; and
an output circuit for receiving signals from said internal circuit and outputting signals to outside,
wherein a gate width of said MOS transistors constituting said data hold circuit is smaller than at least a gate width of MOS transistors constituting said output circuit.

26. A semiconductor device comprising:
an internal circuit having two flip-flop circuits configured to be supplied with the same input signal on the basis of the same clock signal or mutually different clock signals synchronized with each other; and
a logic circuit whose output changes in accordance with a normal change of output signals of said flip-flop circuits.

27. A semiconductor device comprising:

an internal circuit having first and second flip-flop circuits using the same signal as an input, and acquiring input signals on the basis of the same clock signal or mutually different clock signals synchronized with each other; first and second logic circuits whose output changes in accordance with a normal change of the output signals of said first and second flip-flop circuits;

a third flip-flop circuit using the output signal of said first logic circuit as an input thereof;

a fourth flip-flop circuit using the output signal of said second logic circuit as an input thereof; and a third logic circuit whose output changes in accordance with a normal change of the output signals of said third and fourth flip-flop circuits;

wherein said first and second flip-flop circuits enter a data-through state in the first state of said clock signal and a data-hold state in the second state of said clock signal, and said third and fourth flip-flop circuits enter the data-hold state in the first state of said clock signal and the data through state in the second state of said clock signal.

* * * * *